(12) United States Patent
Ohba et al.

(10) Patent No.: US 7,262,064 B2
(45) Date of Patent: Aug. 28, 2007

(54) MAGNETORESISTIVE EFFECT ELEMENT, MAGNETIC MEMORY ELEMENT MAGNETIC MEMORY DEVICE AND MANUFACTURING METHODS THEREOF

(75) Inventors: Kazuhiro Ohba, Miyagi (JP); Kazuhiko Hayashi, Kanagawa (JP); Hiroshi Kano, Kanagawa (JP); Kazuhiro Bessho, Kanagawa (JP); Tetsuya Mizuguchi, Kanagawa (JP); Yutaka Higo, Miyagi (JP); Masanori Hosomi, Miyagi (JP); Tetsuya Yamamoto, Kanagawa (JP); Hiroaki Narisawa, Miyagi (JP); Takeyuki Sone, Miyagi (JP); Keitaro Endo, Miyagi (JP); Shinya Kubo, Miyagi (JP)

(73) Assignee: Sony Corporation, Tokyo (JP)

( * ) Notice: Subject to any disclaimer, the term of this patent is extended or adjusted under 35 U.S.C. 154(b) by 345 days.

(21) Appl. No.: 10/492,147

(22) PCT Filed: Oct. 11, 2002

(86) PCT No.: PCT/JP02/10609

§ 371 (c)(1),
(2), (4) Date: Apr. 9, 2004

(87) PCT Pub. No.: WO03/036734

PCT Pub. Date: May 1, 2003

(65) Prior Publication Data

US 2004/0257719 A1    Dec. 23, 2004

(30) Foreign Application Priority Data

Oct. 12, 2001 (JP) .............................. 2001-315857

(51) Int. Cl.
*H01L 21/00* (2006.01)
*G11B 5/33* (2006.01)
*G11B 5/127* (2006.01)

(52) U.S. Cl. .................. 438/3; 360/315; 360/324.2; 360/325; 257/E21.665

(58) Field of Classification Search ................ 438/3; 360/315, 325, 324.2; 257/E21.665
See application file for complete search history.

(56) References Cited

U.S. PATENT DOCUMENTS 4,236,946 A    12/1980    Aboaf (Continued)

FOREIGN PATENT DOCUMENTS

EP    0 791 915 A2    8/1997

(Continued)

OTHER PUBLICATIONS

M. Jimbo, Giant Magnetoresistance Effect and Electric Conduction in Amorphous-CoFeB/Cu/Co Sandwiches, Apr. 15, 1996, pp. 6237-6239.

*Primary Examiner*—Michael Lebentritt
*Assistant Examiner*—Ron Pompey
(74) *Attorney, Agent, or Firm*—Sonnenschein Nath & Rosenthal LLP

(57) ABSTRACT

In a magnetoresistive effect element using a ferromagnetic tunnel junction having a tunnel barrier layer sandwiched between at least a pair of ferromagnetic layers, a magnetization free layer comprising one of the ferromagnetic layers is composed of a single layer of a material having an amorphous or microcrystal structure or a material layer the main portion of which has an amorphous or microcrystal structure. The magnetoresistive effect element can produce excellent magnetic-resistance characteristics, and a magnetic memory element and a magnetic memory device using the magnetoresistive effect element as a memory element thereof can improve both of write and read characteristics at the same time.

39 Claims, 16 Drawing Sheets

U.S. PATENT DOCUMENTS 6,436,526 B1  8/2002  Odagawa
2002/0058158 A1  5/2002  Odagawa

FOREIGN PATENT DOCUMENTS

| EP | 1061592 | 12/2000 |
| EP | 1 182 713 A2 | 2/2002 |
| JP | 2000-101164 | 4/2000 |
| JP | 2001-068760 | 3/2001 |
| JP | 2001-144345 | 5/2001 |
| JP | 2001-237472 | 8/2001 |
| JP | 2002-204004 | 7/2002 |
| KR | 2001-007428 | 1/2001 |

| Bias Voltage (V) | TMR Ratio (%) | |
|---|---|---|
| | Co20Fe10 | (Co90Fe10)80B20 |
| 0.0 | 42% | 53% |
| 0.1 | 37.0% | 47.5% |
| 0.2 | 32.6% | 42.5% |
| 0.3 | 28.8% | 38.1% |
| 0.4 | 25.4% | 34.1% |
| 0.5 | 22.4% | 30.6% |
| 0.6 | 19.7% | 27.4% |
| 0.7 | 17.4% | 24.5% |
| 0.8 | 15.3% | 22.0% |
| 0.9 | 13.5% | 19.7% |
| 1 | 11.9% | 17.6% |
| $V_h(V)$ | 0.55% | 0.63% |

…

MAGNETORESISTIVE EFFECT ELEMENT, MAGNETIC MEMORY ELEMENT MAGNETIC MEMORY DEVICE AND MANUFACTURING METHODS THEREOF

BACKGROUND OF THE INVENTION

The present invention relates to a magnetoresistive effect element, a magnetic memory element, a magnetic memory device and manufacturing methods thereof, and particularly to a magnetoresistive effect element having stable magnetic characteristics, a magnetic memory element operable as a magnetic nonvolatile memory element, a magnetic memory device composed of the magnetic memory element and manufacturing methods thereof.

As information communication devices, in particular, personal small devices such as personal digital assistants are making great spread, elements such as memories and logics comprising information communication device are requested to have higher performance such as higher integration degree, higher operation speed and lower power consumption. In particular, technologies for making nonvolatile memories become higher in density and larger in storage capacity are progressively increasing their importance as technologies for replacing hard disk and optical disc that cannot be essentially miniaturized because they have movable portions.

As nonvolatile memories, there may be enumerated flash memories using semiconductors and FRAM (Ferro electric Random Access Memory) using ferroelectric material and the like.

However, the flash memory encounters with a drawback that its write speed is as slow as the microsecond order.

On the other hand, it is pointed out that the FRAM has a problem in which it cannot be rewritten so many times.

A magnetic memory device called an MRAM (Magnetic Random Access Memory), (e.g. see "Wang et al., IEEE Trans. Magn. 33 (1977), 4498), receives a remarkable attention as a nonvolatile memory which can overcome these drawbacks.

Since this MRAM is simple in structure, it can easily be integrated at a higher integration degree. Moreover, since it is able to memorize information based upon the rotation of magnetic moment, it can be rewritten so many times. It is also expected that the access time of this magnetic random access memory will be very high, and it was already confirmed that it can be operated at the access time of nanosecond order.

A magnetoresistive effect element for use with this MRAM, in particular, a tunnel magnetoresistive (Tunnel Magnetoresistance) element is fundamentally composed of a lamination layer structure of a ferromagnetic tunnel junction of ferromagnetic layer/tunnel barrier layer/ferromagnetic layer.

This element generates magnetoresistive effect in response to a relative angle between the magnetizations of the two magnetic layers when an external magnetic field is applied to the ferromagnetic layers under the condition in which a constant current is flowing through the ferromagnetic layers. To be concrete, when the magnetization directions of the two magnetic layers are anti-parallel to each other, a resistance value is maximized. When they are parallel to each other, a resistance value is minimized. Function of memory element can be demonstrated by creating the anti-parallel state and the parallel state with application of the external magnetic field when the magnetization direction of one ferromagnetic layer is inverted.

This resistance changing ratio is expressed by the following equation (1) where $P_1$, $P_2$ represent spin polarizabilities of the respective magnetic layers.

$$2P_1P_2/(1-P_1P_2) \qquad (1)$$

The resistance changing ratio increases as the respective spin polarizabilities increase. With respect to a relationship between materials for use with ferromagnetic layers and this resistance changing ratio, ferromagnetic chemical elements of Fe group such as Fe, Co, Ni and alloys of three kinds thereof have already been reported so far.

With respect to writing of information in the MRAM, in order to store information in the selected memory element of the magnetic memory element, this magnetic random access memory is composed of a plurality of bit write lines, a plurality of word lines intersecting these bit write lines and TMR elements provided at crossing points between these bit write lines and word write lines as magnetic memory elements. Then, when information is written only in the element located at the selected crossing point of these bit write line and word write line by utilizing an asteroid characteristic (see Japanese laid-open patent application No. 10-116490, for example).

The bit write line and the word write line used in that case are made of conductive thin films such as Cu and Al which are generally used by semiconductor devices. In this case, when information is written in a magnetic memory element of which the inverted magnetic field for generating the above-mentioned inversion of the magnetization is 40 [Oe], for example, by the bit write line and the word write line, the bit write line and the word write line being 0.35 μm in width, a current of approximately 10 mA was required. In this case, assuming that the thickness of the write line be the same as the line width, then a current density required at that time becomes $8.0 \times 10^{-6}$ A/cm$^2$. There is then a risk that breaking of wire will be caused by electromigration.

Accordingly, from a standpoint of the occurrence of electromigration and further in view of a problem of heat generated by the recording current and from a standpoint of decreasing a power consumption, this recording current has to be decreased.

As a means for decreasing the recording current, there is enumerated a method of decreasing an inverted magnetic field of a TMR element, i.e., coercive force.

The coercive force of this TMR element is determined based upon the size, shape of the element, the film arrangement and the selection of the materials. However, although it is desired that the size of the element should be miniaturized for the purpose of increasing a recording density of the MRAM, for example, the coercive force of the element tends to increase due to the miniaturization of the element. Therefore, the decrease of the coercive force should be attained from the material standpoint.

If the magnetic characteristic of the magnetic memory element is dispersed at every element and the magnetic characteristic is dispersed when the same element is used repeatedly, the selective writing using the asteroid characteristic becomes difficult.

Therefore, the magnetic memory element is requested to have a magnetic characteristic by which an ideal asteroid curve can be drawn. In order to draw the ideal asteroid curve, an R—H (resistance-magnetic field) curve obtained when TMR is measured should not have noises such as a Barkhausen noise, a rectangle property of a waveform should be excellent, the magnetization state should be stable and the dispersion of the coercive force Hc should be small.

Information may be read out from the magnetic memory element as follows. When magnetic moments of one ferromagnetic layer and the other ferromagnetic layer across the tunnel barrier layer are anti-parallel to each other and a resistance value is high, this state is referred to as a "1", for example. Conversely, when the respective magnetic moments are parallel to each other and a resistance value is low, this state is referred to as a "0". Then, information is read out from the magnetic memory element based upon a difference current obtained at a constant bias voltage or a difference voltage obtained at a constant bias current in these "1" and "0" states.

Accordingly, when resistance dispersions between the elements are identical to each other, a higher TMR ratio $(R_{max}-R_{min}) R_{min}$ where a resistance value $R_{min}$ represents the low resistance state and a resistance value $R_{max}$ represents the high resistance state) is advantageous and hence a magnetic memory device that can operate at a high speed, having a high integration degree and having a low error rate can be realized.

A magnetic memory element having a fundamental structure of ferromagnetic layer/tunnel barrier layer/ferromagnetic layer has a bias voltage dependence of TMR ratio., and it is known that the TMR ratio decreases as the bias voltage increases.

When information is read out from the element based upon the difference current or the difference voltage, it is known that the TMR ratio takes the maximum value of the read signal at a voltage (Vh) which decreases by half depending upon the bias voltage dependence. Accordingly, a smaller bias voltage dependence is effective for decreasing read error in the MRAM.

Therefore, the TMR element for use with the MRAM should satisfy the above-mentioned write characteristic requirements and the above-mentioned read characteristic requirements at the same time.

However, when the magnetization free layer is generally made of a magnetic material composed of only ferromagnetic transition metal chemical elements of Co, Fe, Ni, if the alloy compositions by which the spin polarizabilities shown by $P_1$ and $P_2$ in the aforementioned equation (1) are increased are selected, then the coercive force Hc tends to increase.

For example, when the magnetization free layer is made of $Co_{75}Fe_{25}$ (atomic %) alloy and the like, although a TMR ratio having large spin polarizabilities and which is greater than 40% can be maintained, it is unavoidable that the coercive force also increases. But instead, when the magnetization free layer is made of an $Ni_{80}Fe_{20}$ (atomic %) alloy which is referred to as a "permalloy" and the like, although the spin polarizabilities are small as compared with the case in which the magnetization free layer is made of the $Co_{75}Fe_{25}$ (atomic %) alloy so that the TMR ratio is lowered up to about 33%.

Further, when the magnetization free layer is made of a $Co_{90}Fe_{10}$ (atomic %) alloy, although a TMR ratio of about 37% can be obtained and its coercive force can become an intermediate value between the above-mentioned $Co_{75}Fe_{25}$ (atomic %) alloy and $Ni_{89}Fe_{20}$ (atomic %) alloy, this magnetization free layer is inferior in rectangle property of an R—H loop and an asteroid characteristic by which information can be written in the element cannot be obtained.

SUMMARY OF THE INVENTION

The present invention is to provide a magnetoresistive effect element having excellent rectangle property, improved noise and stable magnetic characteristic, a magnetic memory element having these characteristics, improved characteristic dispersion and excellent asteroid characteristics, a magnetic memory device whose write characteristics and read characteristics are improved by this magnetic memory element and methods of manufacturing the magnetoresistive effect element, the magnetic memory element and the magnetic memory device.

A magnetoresistive effect element according to the present invention is a magnetoresistive effect element using a ferromagnetic tunnel junction having a tunnel barrier layer sandwiched between at least a pair of ferromagnetic layers.

A magnetization free layer composed of one of the ferromagnetic layers is comprised of a single layer of a material having an amorphous or microcrystal structure or a material layer the main portion of which has an amorphous or microcrystal structure.

This magnetization free layer contains at least one kind or more than two kinds of metalloid chemical element and metallic chemical element which are 3B-group chemical element, 4B-group chemical element, 5B-group chemical element relative to at least one kind or more than two kinds of components of ferromagnetic chemical elements of Fe, Co, Ni.

As the metalloid chemical element and the metallic chemical element, there can be used any one kind or more than two kinds of B, C, Al, Si, P, Ga, Ge, As, In, Sn, Sb, Tl, Pb, Bi.

More preferably, any one kind or more than two kinds of B, Al, Si, Ge should be used as the metalloid chemical element and the metallic chemical element.

The metalloid chemical element content and the metallic chemical element content of this magnetization free layer are selected within a range of from 5 to 35 atomic %.

Alternatively, the magnetization free layer may contain at least one kind or more than two kinds of 4A-group chemical element, 5A-group chemical element on a periodic table relative to at least one kind or more than two kinds of ferromagnetic chemical elements of Fe, Co, Ni.

In this case, as the 4A-group chemical element and the 5A-group chemical element of the magnetization free layer, there can be used at least one kind or more than two kinds of Ti, Zr, Nb, Hf, Ta.

The 4A-group chemical element content and the 5A-group chemical element content of this magnetization free layer are selected in a range of from 5 to 25 atomic %.

Moreover, the magnetization free layer may contain at least one kind or more than two kinds of metalloid chemical element and metallic chemical element which are 3B-group chemical element, 4B-group chemical element, 5B-group chemical element on a periodic table relative to at least one kind or more than two kinds of components of ferromagnetic chemical elements of Fe, Co, Ni.

Moreover, in this magnetization free layer, i.e., the magnetization free layer that contains at least one kind or more than two kinds of metalloid chemical element and metallic chemical element which are 3B-group chemical element, 4B-group chemical element, 5B-group chemical element on a periodic table and at least one kind or more than two kinds of 4A-group chemical element, 5A-group chemical element on a periodic table relative to at least one kind or more than two kinds of ferromagnetic chemical elements of Fe, Co, Ni, this magnetization free layer contains added chemical elements of Cu, N, O, S, the contents of which are selected to be less than 2 atomic %.

Further, in the magnetoresistive effect element according to the present invention, the above-mentioned main portion of the magnetization free layer is located on the side of the tunnel barrier layer.

Then, the magnetic memory element according to the present invention is a magnetic memory element based upon a magnetoresistive effect element using a ferromagnetic tunnel junction having a tunnel barrier layer sandwiched between at least a pair of ferromagnetic layers. An information storage layer based upon a magnetization free layer composed of one of the ferromagnetic layers is comprised of a single layer of a material having an amorphous or microcrystal structure or a material layer the main portion of which has an amorphous or microcrystal structure.

The information storage layer in this magnetic memory element has arrangements similar to those of the magnetization free layer in the above-mentioned magnetoresistive effect element.

Moreover, a magnetic memory device according to the present invention includes a word line and a bit line crossing each other in a three-dimensional fashion and a magnetic memory element composed of a magnetoresistive effect element having the above-mentioned respective arrangements of the present invention located at the portions in which these word lines and bit lines cross each other.

DETAILED DESCRIPTION OF THE PRESENTLY PREFERRED EMBODIMENTS

A magnetoresistive effect element according to an embodiment of the present invention is a magnetoresistive effect element suitable for use as a magnetic sensor, for example.

Moreover, a magnetic memory element according to the present invention is a memory element that can be applied to each memory element of a magnetic memory device.

Further, a magnetic memory device according to the present invention has an arrangement in which a plurality of bit write lines (hereinafter referred to as "bit lines" or "BL") and word write lines (hereinafter referred to as "word lines" or "WL" or "WWL") are crossing each other in a three-dimensional fashion, magnetic memory elements according to the present invention being located at crossing points where the bit lines and the word lines are crossing each other in a three-dimensional fashion.

First, the fundamental arrangements of the magnetoresistive effect element and the magnetic memory element according to the present invention are equal to each other, and therefore these magnetoresistive effect element and magnetic memory element will be described.

[Magnetoresistive Effect Element and Magnetic Memory Element]

A magnetoresistive effect element and a magnetic memory element according to the present invention have a ferromagnetic tunnel junction structure having a tunnel barrier layer sandwiched between at least a pair of ferromagnetic layers.

Figure 1A:
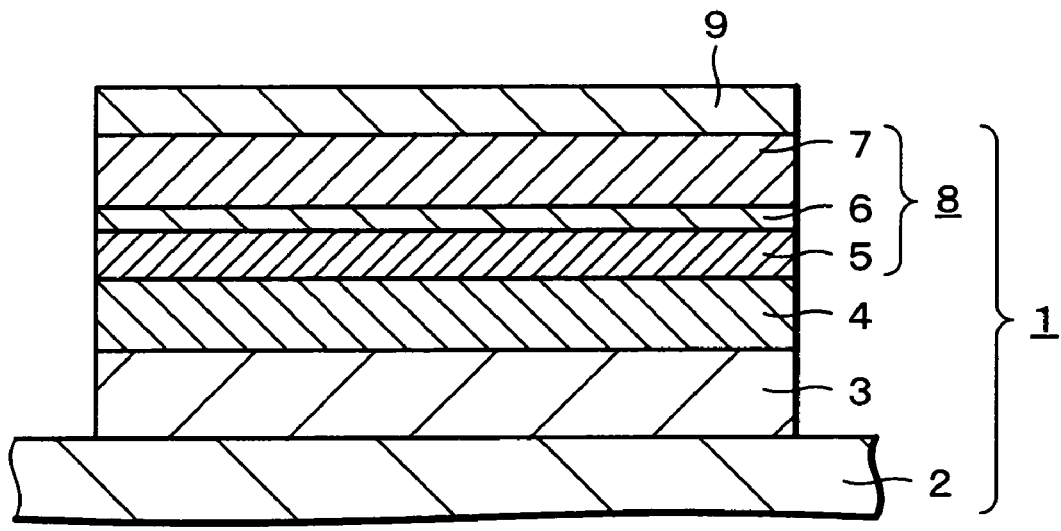
FIGS. 1A and 1B are respectively cross-sectional views of an example of a magnetoresistive effect element or a magnetic memory element according to the present invention.

FIG. 1A is a schematic cross-sectional view of an example of a magnetoresistive effect element or a magnetic memory element 1 based upon a TMR element having this ferromagnetic tunnel junction structure. In this embodiment, an underlayer 3 is formed on a substrate, e.g. Si substrate, and an antiferromagnetic layer 4 is formed on the substrate through this underlayer 3. A ferromagnetic tunnel junction portion 8 on which a ferromagnetic layer 5 (hereinafter referred to as a "first ferromagnetic layer"), a tunnel barrier layer 6 and a ferromagnetic layer 7 (hereinafter referred to as a "second ferromagnetic layer") are laminated in that order is formed on the antiferromagnetic layer.

Then, a protective layer 9 which might be called a top-coat layer is formed on this ferromagnetic tunnel junction portion 8.

The first ferromagnetic layer 5 is a magnetization fixed layer of which the magnetization direction is fixed, and the second ferromagnetic layer 7 is a magnetization free layer of which the magnetization direction is inverted, which is an information storage layer in the magnetic memory element.

This magnetization free layer or the second ferromagnetic layer 7 comprising the information storage layer has an amorphous or microcrystal structure in which the following alloy chemical elements were added to transition metals (hereinafter referred to as an "FMTM") of at least one kind or more than two kinds of Fe, Ni, Co.

Since the magnetization free layer and the information storage layer based upon the ferromagnetic layer 7 has the amorphous or microcrystal structure as described above, it can decrease a coercive force while a spin polarizability of the FMTM is being maintained, it can obtain a soft magnetic characteristic to improve a Barkhausen noise in an R—H curve and a rectangle property, it can serve as the information storage layer to decrease dispersions in writing information when the magnetic field is inverted repeatedly and therefore can obtain satisfactory write characteristics. At the same time, it can realize a high TMR ratio and can obtain excellent read characteristics in which a bias dependence characteristic has been improved.

As chemical elements added to the FMTM that can achieve the above-mentioned effects, i.e., objects, chemical elements are roughly classified into the following classes 1 to 3.

Class 1. Addition of metalloid chemical elements and metallic chemical elements of 3B-group chemical elements to 5B-group chemical elements on a periodic table.

Class 2. Addition of 4A-group chemical elements and 5A-group chemical elements on a periodic table.

Class 3. Addition of either of or both of the chemical elements on the classes 1 and 2 and addition of very small amounts of chemical elements of Cu, O, N, etc.

In the magnetoresistive effect element and the magnetic memory element according to the present invention, the second ferromagnetic layer 7 contains the FMTM that may contain the alloy added components shown in the above-described classes 1 and 2 for the purpose of decreasing the coercive force while maintaining the spin polarizability. Insofar as the above-mentioned objects are achieved, the second ferromagnetic layer may contain the FMTM and other components than the added components shown on the above-described classes 1 and 2.

The above-described class 1 intends to make the magnetization free layer become amorphous. As examples of alloy-based components for making the magnetization free layer become amorphous in which one kind of metalloid is added to the FMTM, there may be listed alloy-based components in which 3B-group chemical elements to 5B-group chemical elements are added to the FMTM on a periodic table, such as FMTM-SI alloy, FMTM-B alloy, FMTM-P alloy and FMTM-C alloy. However, the FMTM-Si alloy and the FMTM-B alloy should preferably be used as the above-mentioned alloy-based component.

Insofar as the above-mentioned objects can be attained, the alloy-based component may contain more than two kinds of 3B-group and 4B-group metalloids on the periodic table. As alloy-based components that can be listed in this case, there may be enumerated a large number of combinations such as FMTM-B—C alloy, FMTM-B—P alloy, FMTM-B—Ge alloy, FMTM-Si—B alloy, FMTM-Si—P alloy, FMTM-Si—C alloy, FMTM-Si—Al alloy . . . . Of these alloy-based components, FMTM-B alloy, FMTM-Si—B alloy and FMTM-Si—Al alloy should preferably be used as the above-mentioned alloy-based component.

The above-described class 2 also intends to achieve effects for improving ability for making the magnetization free layer become amorphous or improving fine structure of crystal grains, 4A-group chemical elements and 5A-group chemical elements (preferably Ti, Zr, Hf, Nb, Ta) are added to the above-mentioned alloy-based component. As alloy-based components, there may be listed combinations such as FMTM-Ti alloy, FMTM-Zr alloy, FMTM-Hf alloy, FMTM-Nb alloy, FMTM-Ta alloy, FMTM-Zr—Nb alloy, FMTM-Ta—Nb alloy, FMTM-Ti—Zr alloy., FMTM-Zr—Ta alloy, FMTM-Zr—Nb—Ta alloy, FMTM-Zr—Nb alloy . . . . However, of these alloy-based components, there should preferably be listed FMTM-Zr—Nb alloy, FMTM-Zr—Ta alloy, FMTM-Ta—Nb alloy and the like.

The above-described class 3 intends to improve ability for making the magnetization free layer become amorphous or improving fine structure of crystal grains rather than effects achieved by the metalloids on the classes 1 and 2 and in which the metalloid chemical elements, the metallic elements and other chemical elements are added to alloy-based components. As the alloy-based components in this example, there may be listed innumerable combinations such as ternary alloys such as FMTM-B—Nb alloy, FMTM-B—Zr alloy, FMTM-Si—Al alloy, FMTM-Si—Nb alloy, FMTM-Si—Zr alloy, quaternary alloys such as FMTM-Si—B—Al alloy, FMTM-Si—B—Nb alloy . . . . Moreover, main components of chemical elements added to the FMTM may belong to the above-described classes 1 and 2 and the above-mentioned alloy-based component may contain other classes such as Cu, O, N. Of these alloy-based components, there should preferably be listed FMTM-Si—Al alloy, FMTM-Zr—B alloy, FMTM-Si—Cu alloy, FMTM-Nb—SiB alloy, FMTM-Si—B—Cu alloy, FMTM-Si—B—Zr—Cu alloy, FMTM-Si—B—Nb—Cu alloy and the like.

As described above, when the alloy elements are added to the magnetization free layer to thereby decrease a coercive force while a spin polarizability for obtaining a large resistance changing ratio of the information storage layer is being maintained, if the added chemical elements such as 3B-group metalloids to 5B-group metalloids and 4A-group chemical elements and 5A-group chemical elements relative to the FMTM are increased too much, then the amount of the ferromagnetic transition metal chemical element FMTM decreases excessively so that the film characteristic lost its ferromagnetism unavoidably. If a resistance value of a target increases too much, then when this magnetic layer is deposited by a suitable method such as a DC magnetron sputtering method, it becomes difficult to deposit the magnetic layer, and hence a trouble arises, in which a film of high quality cannot be deposited.

In that case, although the cause is not yet clear, troubles arise, in which a magnetic resistance changing ratio decreases. Therefore, it is to be desired that the added amounts of metalloid chemical elements and metallic chemical elements (preferably B, Si, Al, Ge) which are 3B-group chemical elements to 5B-group chemical elements on the periodic table in the case of the class 1 should be less than 50% although the above-mentioned added amounts may change depending on the composition of TM.

If the amount of added chemical elements is too large, then it is frequently observed that the film characteristic no longer demonstrates its ferromagnetism. Accordingly, in order to obtain the amorphous or microcrystal system structure, if one kind or more than two kinds of elements are in use, then it is to be desired that the total amount of added chemical amounts should fall within a range of from 5 to 35 atomic %.

Even when the magnetic layer is given the microcrystal structure, if the chemical element B is added to the magnetization free layer, then so long as ferromagnetic deposits such as FeB, $Fe_2B$, $Fe_3B$, $Co_2B$ and $Co_3B$ can be obtained, it is to be desired that the added amount of this chemical element should fall within a range of from 5 to 35 atomic %.

When 4A-group chemical element and 5A-group chemical element (preferably, Ti, Zr, Hf, Nb, Ta) on the above-described class 2 are added to the magnetization free layer, if the added amount of these chemical elements is too large, then when the magnetization free layer cannot have the amorphous structure and loses its ferromagnetism so that a magnetic characteristic is degraded, thereby lowering a TMR ratio. For these reasons, it is desirable that the added amount should be about 20 atomic % at most and that it should be less than the foregoing numerical value.

When chemical elements on both of the above-described classes 1 and 2 are added to the magnetization free layer, if the added amount is too large, then the magnetization free layer loses its ferromagnetism and it becomes difficult to obtain a desired amorphous structure or a desired microcrystal system as well. Therefore, it is to be desired that the amounts of these chemical elements added to the FMTM should be less than approximately 35 atomic % similarly to the case of the 3B-group chemical elements to the 5B-group chemical elements on the class 1.

So long as the chemical elements on the classes 1 and 2 are both added to the FMTM and these chemical elements are main components of the added chemical elements, the magnetization free layer may contain a very small amount of chemical elements such as Cu, O, S. This will apply for other chemical elements added as well.

Well-known amorphous and microcrystal soft magnetic materials that are appearing in the page 298 of "HANDBOOK OF MAGNETIC ENGINEERING written by Kenji Kawanishi, Soshin Chikazumi, Yoshifumi Sakurai" can be used so long as they meet with the requirements that have been enumerated so far.

When the second ferromagnetic layer, i.e., the magnetization free layer or the information storage layer is comprised of the magnetic material layers having these amorphous and microcrystal structures, in order to achieve effects for reducing a coercive force, i.e., inverted magnetic field and effects for maintaining a TMR ratio by the amorphous or microcrystal structure, it is to be desired that this magnetization free layer or the information storage layer should have a single-layer structure made of this magnetic material or that most of the main portion of the magnetization free layer or the information storage layer should be comprised of this magnetic material layer.

On the other hand, as shown in FIG. 1A, for example, since the magnetization fixed layer includes the antiferromagnetic material layer 4 which is coupled to the first ferromagnetic layer 5 in an antiferromagnetic fashion, even when a current magnetic field for recording information on a magnetic memory, for example, is applied to the magnetoresistive effect element or the magnetic memory element, the magnetization direction of the magnetization fixed layer can be prevented from being inverted.

A ferromagnetic material comprising the first ferromagnetic layer 5 of this magnetization fixed layer is not limited to some specific ferromagnetic material but an alloy material composed of one kind or more than two kinds of Fe, Ni, Co can be used as the above ferromagnetic material.

Moreover, a material comprising the antiferromagnetic layer 4 may be comprised of Mn alloy such as Fe, Ni, Pt, Ir, Rh, Co and Ni oxide, etc.

Figure 1B:
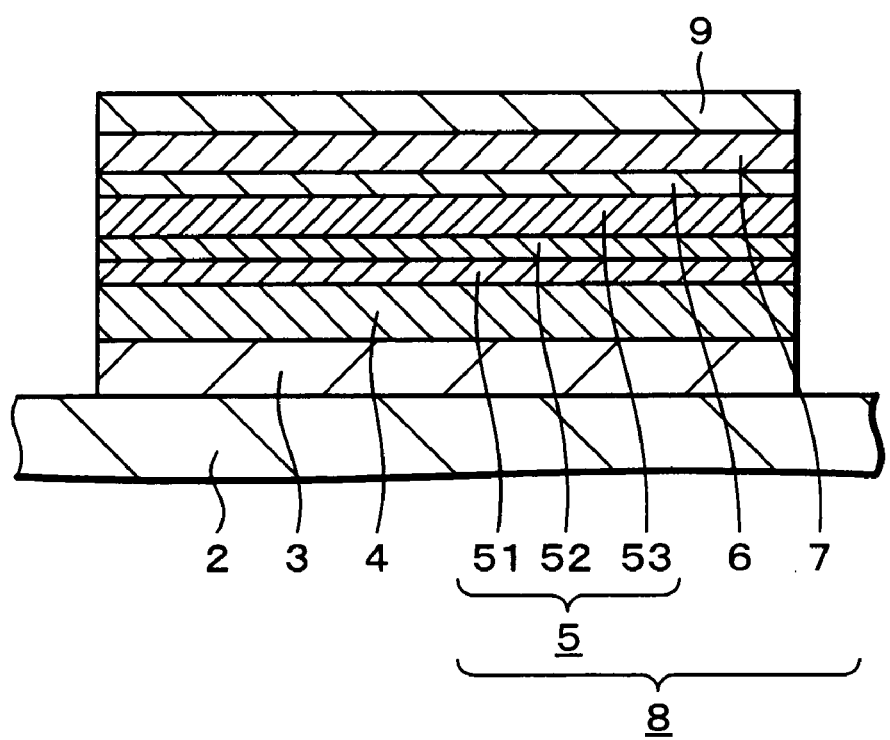

FIG. 1B shows a schematic cross-sectional view of an example of the magnetoresistive effect element or the magnetic memory element. As illustrated, the first ferromagnetic layer 5, i.e., the magnetization fixed layer can be formed so as to have a lamination layer ferri structure composed of a first ferromagnetic material layer 51, a non-magnetic conductive layer 52 and a second ferromagnetic material layer 53.

Also in this case, the first ferromagnetic material layer 51 is in contact with the antiferromagnetic layer 4, and hence the magnetization fixed layer 5 is given a strong magnetic anisotropy of one direction by exchange interaction acting on these two layers.

The conductive layer 52 in that case can be made of a suitable material such as Ru, Cu, Cr, Au and As.

In FIG. 1B, elements and parts identical to those of FIG. 1A are denoted by identical reference numerals and therefore need not be described.

A tunnel barrier layer 6 is interposed between the first and second ferromagnetic layers 5 and 7 shown in FIGS. 1A and 1B as described above. This tunnel barrier layer lying between the two ferromagnetic layers plays a role not only to break a magnetic coupling between the first ferromagnetic layer 5, i.e., the magnetization fixed layer and the magnetization free layer or the information storage layer of the second ferromagnetic layer 7 but also to cause a tunnel current to flow.

This tunnel barrier layer 6 can be made of an insulating thin film layer of thin films of oxide such as Al, Mg, Si, Ca, nitride, halogenide and the like.

[Manufacturing Methods of Magnetoresistive Effect Element and Memory Element]

Respective layers, i.e., respective magnetic layers and conductive layer comprising these magnetoresistive effect element and magnetic memory element can be formed by a vapor deposition method, sputtering, i.e., sputtering vapor deposition method.

Then, the tunnel barrier layer 6 can be formed by oxidizing or nitriding a metal film thus formed by sputtering, for example. Alternatively, the tunnel barrier layer can be formed by a chemical vapor deposition (CVD) method using organic metals, oxygen, ozone, nitrogen or halogen and halogenated gas.

The magnetization free layer, e.g. the second ferromagnetic layer 7 comprising the information recording layer can be manufactured by a vapor-phase growth method such as a vacuum deposition method, a sputtering vapor deposition method and a CVD (Chemical Vapor Deposition) method or other suitable method such as electrolytic plating and non-electrolytic plating.

However, when a TMR film has a thickness ranging from several nanometers to several 10s of nanometers as in the case of comprising an MRAM, in general, it is to be desired that the magnetization free layer or the second ferromagnetic layer should be formed by a vapor-phase growth method such as sputtering.

When the magnetization free layer or the second ferromagnetic layer is deposited by the above-mentioned vapor-phase growth method, for example, if it is deposited under the condition in which the substrate 2 is not heated, then an amorphous film can be deposited based upon compositions of materials for depositing the film and deposition conditions.

Specifically, when the magnetization free layer based on the second ferromagnetic layer 7, e.g. information storage layer is formed so as to have an amorphous film arrangement, since grain boundary does not exist any longer, homogeneity within this ferromagnetic layer can be improved. Thus, even when the composition ratios of the FMTM components are equal, the magnetization free layer is formed as the amorphous magnetization free layer by addition of amorphous chemical elements, thereby making it possible to decrease a coercive force.

In that case, in order to deposit the amorphous film, it is to be desired that a substrate temperature required when the amorphous film is deposited should be kept under 100° C. by a suitable method such as cooling.

Moreover, there can be used a method for generating finer crystal systems by changing the film in the form of amorphous state to crystal state. In this case, in order to demonstrate desired magnetic characteristics, the crystal system should preferably be made finer and more uniform, and it is desirable that a particle size should be made under at least 2 nm.

It is to be desired that a temperature in the heat treatment in that case should be a temperature higher than approximately a temperature at which the material may be crystallized and that this temperature should be made lower than a temperature at which a particle size of deposited microcrystal may be increased by recrystallization.

A magnetic memory device according to an embodiment of the present invention will be described next.

[Magnetic Memory Device]

In a magnetic memory device according to the present invention, a magnetic memory element comprising a memory cell is comprised of the above-mentioned magnetic memory element 1 according to the present invention.

Figure 2:
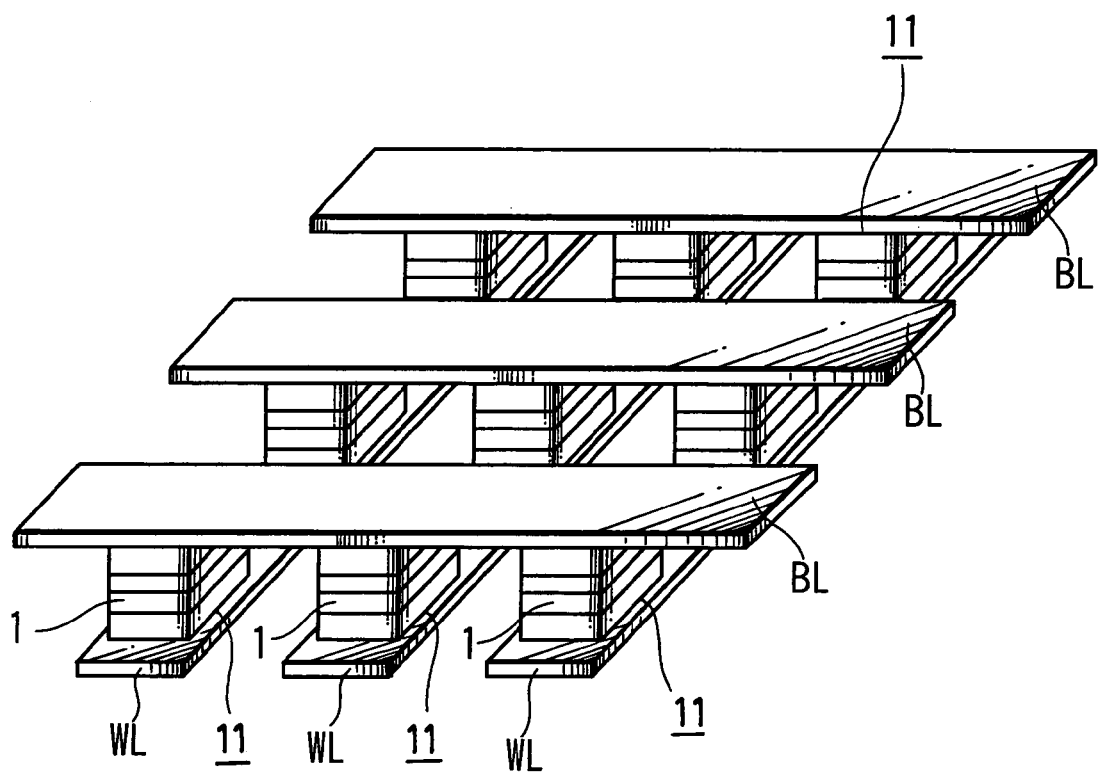
FIG. 2 is a perspective view of a main portion of an example of a magnetic memory device according to the present invention.
Figure 3:
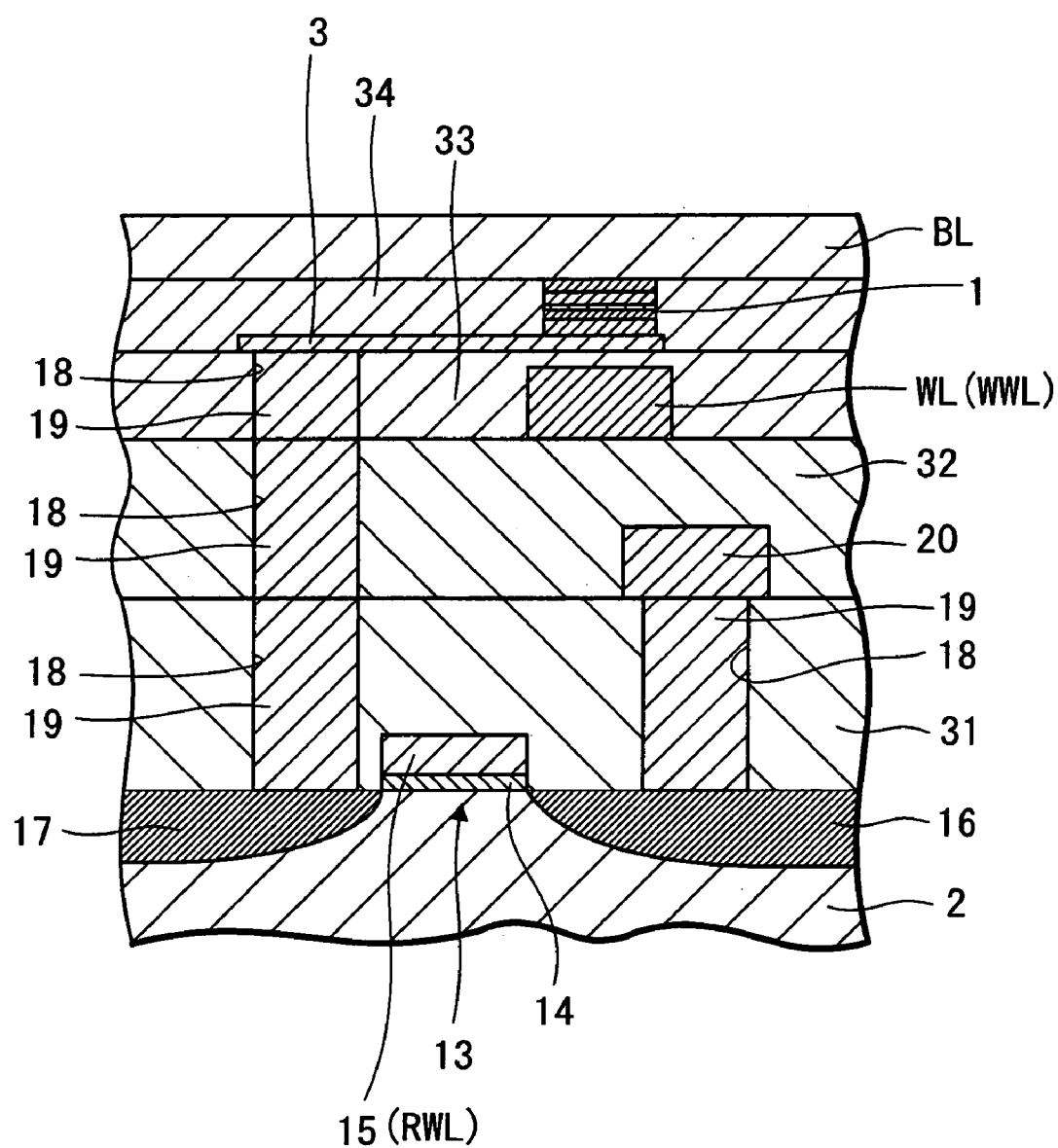
FIG. 3 is a schematic cross-sectional view showing an example of a magnetic memory element according to the present invention.

This magnetic memory device can be formed so as to have a cross-point type MRAM array structure as FIG. 2 shows a perspective view of a schematic arrangement of a main portion of an example of this magnetic memory device and FIG. 3 shows a schematic cross-sectional view of one memory cell.

Specifically, this MRAM includes a plurality of word lines WL arrayed in parallel to each other and a plurality of bit lines BL arrayed in parallel to each other such that these bit lines may cross these word lines in a three-dimensional fashion. The magnetic memory elements 1 according to the present invention are located at portions in which these word lines WL and these bit lines BL cross each other in a three-dimensional fashion, memory cells 11 being constructed at these intersecting portions.

FIG. 2 shows the magnetic memory device at its portion in which 3×3 memory cells are disposed in a matrix fashion.

FIG. 3 shows a schematic cross-sectional view of this memory cell. In this case, a switching transistor 13 is formed on a semiconductor substrate 2 composed of a silicon substrate, i.e., semiconductor wafer, for example.

This transistor is comprised of an insulating gate field-effect type transistor, e.g., MOS transistor. In this case, on the semiconductor substrate 2, there is formed a gate insulating layer 14 on which an insulating gate portion with a gate electrode 15 deposited thereon is constructed.

The semiconductor substrate 2 has a source region 16 and a drain region 17 formed across the insulating gate portion. In this arrangement, the gate electrode 15 constructs a read word line RWL.

The semiconductor substrate 2 with this transistor 13 formed thereon has a first interlayer insulator 31 formed thereon over the gate electrode 15. Contact holes 18 are bored on the respective source region 16 and drain region 17 of the first interlayer insulator 31 through the interlayer insulator 31, and conductive plugs 19 are filled into the respective contact holes 18.

Then, an interconnection layer 20 for the source region 16 is deposited on the first interlayer insulator 31 over the conductive plug 19 that is brought in contact with the source region 16.

Further, a second interlayer insulator 32 is formed on the first interlayer insulator 31 so as to cover the interconnection layer 20.

The contact hole 18 is bored on the second interlayer insulator 32 over the conductive plug 19 in contact with the drain region 17, and the conductive plug 19 is filled into the contact hole.

A write word line WWL corresponding to the word line WL in FIG. 2 is formed on the second interlayer insulator 32 along the direction in which the read word line RWL, for example, extends.

A third interlayer insulator 33 made of silicon oxide, for example is formed on the second interlayer insulator 32 so as to cover the write word line WWL. Also in the third interlayer insulator 33, the contact hole 18 is bored through the conductive plug 19 that is brought in contact with the drain region 17, and the conductive plug 19 is filled into the contact hole.

Then, the underlayer 3 made of a conductive material, e.g., Ta is formed on the third interlayer insulator 33 in contact with the conductive plug 19 that extends through this third interlayer insulator 33 as shown in FIGS. 1 to 3, for example, and the magnetic memory element 1 is formed on this underlayer 3.

Further, a fourth interlayer insulator 34 is formed on the underlayer 3 so as to cover the magnetic memory element 1, and the bit line BL is formed on this underlayer insulator across the write word line WL.

A surface insulating layer is formed on the bit line BL according to the need although not shown.

The above-mentioned first to fourth interlayer insulators, the surface insulating layer and the like can be formed with application of plasma CVD, for example.

These memory cells 11 are arrayed on the common semiconductor substrate 2, i.e., semiconductor wafer in a matrix fashion as shown in FIG. 2.

Next, the antiferromagnetic layer 4 is regulated in magnetization direction, i.e., the antiferromagnetic layer 4 is magnetized in the predetermined direction by a field anneal treatment, whereby the magnetization of the magnetization fixed layer 5 composed of a ferromagnetic layer in contact with this antiferromagnetic layer 4 and which is coupled to this antiferromagnetic layer in an antiferromagnetic fashion can be fixed to one direction.

In the magnetic memory device having this arrangement, when a predetermined current flows to the bit line BL and the write word line WL (WWL), the magnetization direction of the magnetization free layer is inverted to record information by applying a predetermined write magnetic field of a synthesized magnetic field of magnetic fields from the two bit line BL and write word line WL to the magnetoresistive effect element of the memory cell 11 at the selected intersection point, e.g., the magnetization free layer of the TMR element 1.

When information is read out from the magnetic memory device, the transistor 13 is turned ON by applying a predetermined ON voltage to the gate electrode 15 of the transistor 13 relating to the selected memory cell from which information is read out, i.e., the read word line RWL to cause a read current to flow through the bit line BL and the interconnection layer 20 of the source region 16 of the transistor 13, thereby resulting in information being read out from the memory cell.

When the magnetic memory device according to the present invention is manufactured, the aforementioned manufacturing method can be applied to the magnetic memory element.

Next, inventive examples will be described. While magnetic memory elements in these inventive examples are suitable for use with the memory element of the aforementioned MRAM shown in FIGS. 2 and 3, it is needless to say that they can be applied to magnetic memory elements in other semiconductor integrated circuits, electronic circuits and the like.

INVENTIVE EXAMPLE 1

A magnetic memory element according to this inventive example was formed as a TMR element including a ferromagnetic tunnel junction portion having a fundamental structure based upon a lamination layer of the aforementioned ferromagnetic material layer 5/tunnel barrier layer 6/ferromagnetic material layer 7, i.e., MTJ (Magnetic Tunnel Junction).

In this case, the first ferromagnetic layer 5 is formed so as to have a lamination layer ferri structure.

Moreover, in this case, as in the spin-valve type memory, the ferromagnetic layer 5 is formed as the magnetization fixed layer, of which the magnetization direction is fixed by the antiferromagnetic layer 4 so that the direction of the magnetization is constantly set to be constant. The other ferromagnetic layer 7 is formed as the magnetization free layer, i.e., the information storage layers so that the direction of the magnetization is inverted with application of external magnetic fields.

Figure 4A:
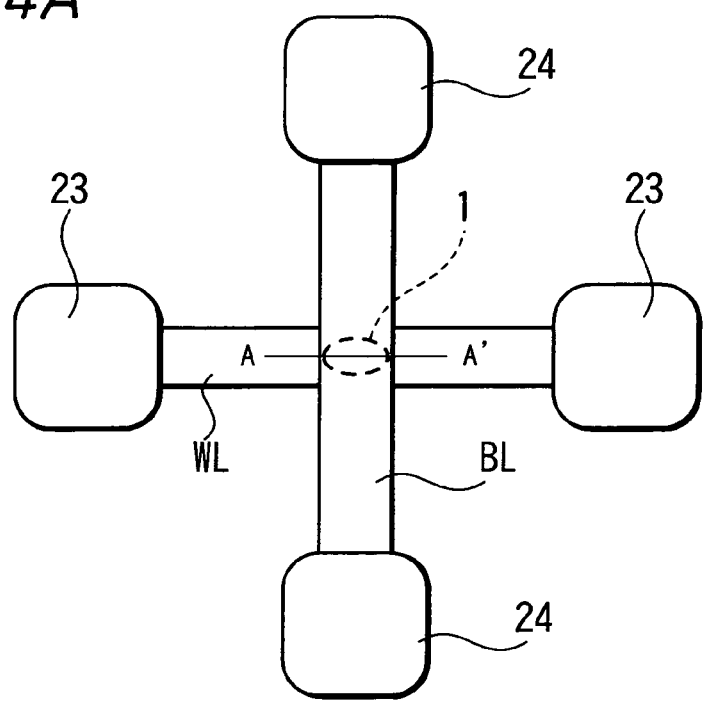
FIG. 4A is a schematic plan view of a test element sample of a magnetic memory element.
Figure 4B:
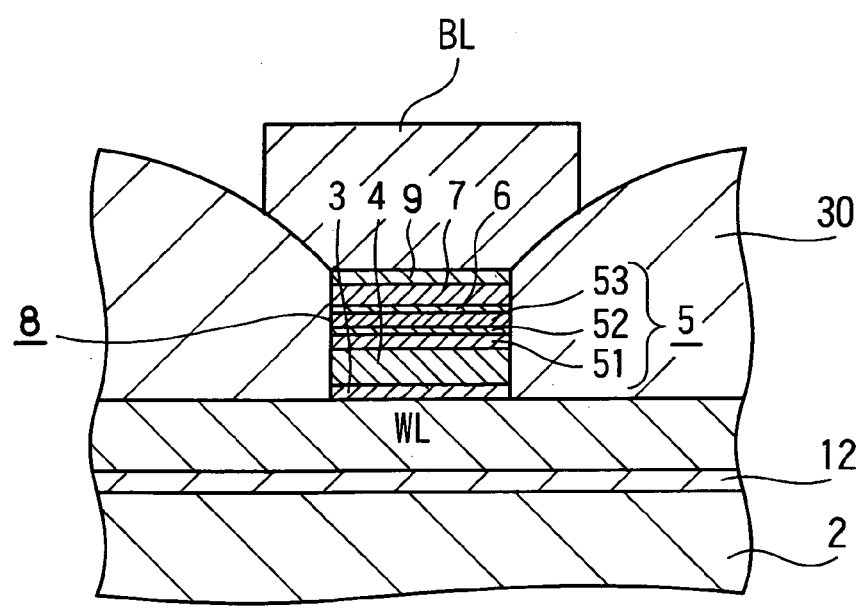
FIG. 4B is a cross-sectional view taken along the line A-A in FIG. 4A.

In this inventive example, as FIG. 4A shows a plan view of a main portion of the magnetic memory element and as FIG. 4B shows a cross-sectional view taken along the line A-A' in FIG. 4A, the switching transistor shown in FIG. 3 and the like were removed from this magnetic memory element in order to examine magnetoresistive characteristics of the element.

In this inventive example, first, we have prepared a. 0.525 mm-thick Si semiconductor substrate 2 on which there has been formed a 300 nm-thick insulating layer 12 composed of a heat oxide film.

A metal film comprising word lines was formed on the whole surface of this semiconductor substrate 2, and a word line WL that extends in one direction was formed by pattern-etching according to photolithography.

At that time, in the etched portion other than the portion in which the word line WL is formed, the oxide film of the semiconductor substrate 2, i.e., the insulating film 12 was etched up to the depth of 5 nm.

The magnetic memory element (TMR element) 1 was formed on this word line WL. This TMR element 1 had a lamination layer structure comprised of underlayer 3/antiferromagnetic layer 4/ferromagnetic material layer 51 of first ferromagnetic layer/conductive layer 52, second ferromagnetic material layer 53/tunnel barrier layer 6/second ferromagnetic layer 7/protective layer 8, in that order, from below. The arrangement of each layer has a lamination layer structure comprising Ta (3 nm)/PtMn (30 nm)/$Co_{90}Fe_{10}$ (2 nm)/Ru (0.8)/$Co_{90}Fe_{10}$ (2 nm)/oxide film of Al (1 nm)/$(Co_{90}Fe_{10})_{100-x}Ml_x$/Ta (5 nm). (In the written form expressing this lamination layer state, a suffix of each chemical element represents an atomic % and a numerical value within each parenthesis and which is indicated at the unit of nm represents a film thickness of each layer. This will apply for the following descriptions as well) The TMR film 1 is composed of a part of this lamination layer film. To this end, a mask layer (not shown) was formed on the lamination layer film at its portion in which the TMR element 1 is formed by a photoresist layer, and the pattern of the TMR element 1 with elliptical flat surface was etched by dry etching using photolithography.

The pattern of the TMR element 1 in that case had an elliptical shape with a minor axis of 0.8 g m and a major axis of 1.6 µm.

Of this film arrangement, other portions than the tunnel barrier layer of the Al oxide were deposited by a DC magnetron sputtering method. The tunnel barrier layer of the Al oxide was formed as follows. First, a metal Al film having a thickness of 1 nm was deposited by a DC sputtering system, and the tunnel barrier layer was formed by plasma-oxidizing a metal Al film with an oxygen:argon flow rate of 1:1 at chamber gas pressure of 0.1 mTorr by an ICP (Inductive Coupled Plasma: inductive coupled plasma). The oxidation time may change depending upon an ICP output and was selected to be 30 seconds in this inventive example.

Thereafter, the test sample was annealed within a field anneal furnace with application of an electric field of 10 [kOe] at 270° C. for 4 hours, and the magnetization of the first ferromagnetic layer 5 was fixed to one direction by effecting PtMn regulation heat treatment on the antiferromagnetic layer 4.

In this inventive example, the composition of CoFe other than the second ferromagnetic layer 7 comprising the magnetization free layer (information storage layer) was selected to be $Co_{90}Fe_{10}$ (atomic %). Then, the composition of the second ferromagnetic layer 7 was selected to be $(Co_{90}Fe_{10})_{100-x}Ml_x$, and in order to contrast the result of this inventive example with a result of $Co_{90}Fe_{10}$ alloy of a comparative example 1 which will be described later on, a ratio of ferromagnetic transition metal chemical elements of Co and Fe was fixed to $Co_{90}$: $Fe_{10}$ and the amount of Ml (B, Si, Al, Ge) was changed from one atomic % to 40 atomic %.

In the TMR element 1 formed on the above-mentioned substrate 2, as shown in FIG. 4B, an $Al_2O_3$ insulating layer 30 is treated by sputtering, an opening is formed through the TMR element 1 by etching using photolithography and a bit line BL extending in one direction crossing the extending direction of the word line WL is formed over the insulating layer 30 through this opening by deposition of a metal film and pattern etching using photolithography.

Terminal pads 23 and 24 for use in measuring characteristics are formed on each of both ends of the respective word line WL and bit line BL at the same time the word line and the bit line are formed.

INVENTIVE EXAMPLE 2

In the film arrangement of the TMR element 1, except that the composition of the second ferromagnetic layer 7, i.e., the magnetization free layer (information storage layer) was selected to be $(Co_{90}Fe_{10})_{75}Si_{15}Ml_{10}$ and that Ml was selected to be B, C, P, Al, this inventive example had a similar arrangement to that of the inventive example 1.

INVENTIVE EXAMPLE 3

In the film arrangement of the TMR element 1, except that the composition of the second ferromagnetic layer 7, i.e., the magnetization free layer (information storage layer) was selected to be $(Co_{90}Fe_{10})_{80}B_{20}$, $(Co_{75}Fe_{25})_{80}B_{20}$, $(Co_{50}Fe_{50})_{80}B_{20}$, $(Ni_{80}Fe_{20})_{80}B_{20}$, this inventive example had a similar arrangement to that of the inventive example 1.

INVENTIVE EXAMPLE 4

In the film arrangement of the TMR element 1, except that the composition of the second ferromagnetic layer 7, i.e., the magnetization free layer (information storage layer) was selected to be $(Co_{90}Fe_{10})_{100-x}M2_x$, M2 was selected to be Ti, Zr, Nb, Ta and that the composition ratio was changed from 0 to 40 atomic %, this inventive example had a similar arrangement to that of the inventive example 1.

INVENTIVE EXAMPLE 5

In the film arrangement of the TMR element 1, except that the composition of the second ferromagnetic layer 7, i.e., the magnetization free layer (information storage layer) was selected to be $(Co_{90}Fe_{10})_{90-x}B_{10}M2_x$, M2 was selected to be Ti, Zr, Nb, Ta and that the composition ratio was changed from 0 to 20 atomic %, this inventive example had a similar arrangement to that of the inventive example 1.

INVENTIVE EXAMPLE 6

In the film arrangement of the TMR element 1, except that the composition of the second ferromagnetic layer 7, i.e., the magnetization free layer (information storage layer) was selected to be $(Co_{90}Fe_{10})_{73.5}Cu_1Nb_3Si_{13.5}B_9$ and $(Co_{90}Fe_{10})_{73.5}Cu_1Nb_3Si_{16.5}B_6$, this inventive example had a similar arrangement to that of the inventive example 1.

INVENTIVE EXAMPLE 7

In this inventive example, the following two samples (1), (2) were manufactured. In the film arrangement of the TMR element 1, the sample 1 had the composition of the second ferromagnetic layer 7, i.e., the magnetization free layer (information storage layer) selected as Substrate/Ta (3 nm)/PtMn (30 nm)/$Co_{90}Fe_{10}$ (2 nm)/Ru (0.8 nm)/$Co_{90}Fe_{10}$ (2 nm)/oxide film of Al (1 nm) $(Co_{90}Fe_{10})_{80}$ $B_{20}$ (2 nm)/ $Co_{90}Fe_{10}$ (1 nm)/Ta (5 nm)

The sample 2 had the above-mentioned composition selected as Substrate/Ta (3 nm)/PtMn (30 nm)/$Co_{90}Fe_{10}$ (2 nm)/Ru (0.8 nm)/$Co_{90}Fe_{10}$ (2 nm)/oxide film of Al (1 nm) $(Co_{90}Fe_{10})_{80}B_{20}$ (1 nm)/$Co_{90}Fe_{10}$ (1 nm) $(Co_{90}Fe_{10})_{80}B_{20}$ (1 nm)/Ta (5 nm)

Except that the second ferromagnetic layer 7 has the above-mentioned arrangement, any of these samples (1) and (2) has a similar arrangement to that of the inventive example 1.

COMPARATIVE EXAMPLE 1

In the film arrangement of the TMR element 1, except that the composition of the second ferromagnetic layer 7, i.e., the magnetization free layer (information storage layer) was selected to be $Co_{90}Fe_{10}$, $Co_{75}Fe_{25}$, $Co_{50}Fe_{50}$, $Ni_{80}Fe_{20}$, this comparative example had a similar arrangement to that of the inventive example 1.

COMPARATIVE EXAMPLE 2

In the film arrangement of the TMR element 1, the composition of the second ferromagnetic layer 7, i.e., the magnetization free layer (information storage layer) was selected to be Substrate/Ta (3 nm)/PtMn (30 nm)/$Co_{90}Fe_{10}$ (2 nm)/Ru (0.8 nm)/$Co_{90}Fe_{10}$ (2 nm)/oxide film of Al (1 nm)/$(Co_{90}Fe_{10})_{100-x}M3_x$ (3 nm)/Ta (5 nm)

In this film arrangement, the CoFe composition under the tunnel barrier layer other than the magnetization free layer was selected to be $Co_{90}Fe_{10}$ (atomic %). With respect to the $(Co_{90}Fe_{10})_{100-x}M3_x$, in order to contrast its result with the $Co_{90}Fe_{10}$ alloy of the comparative example 1, a ratio between the ferromagnetic transition metal chemical elements of Co and Fe was fixed to $Co_{90}Fe_{10}$ (atomic %), the amount of M3 (Mg, Zn) was changed from 1 atomic % to 40 atomic %.

COMPARATIVE EXAMPLE 3

In the film arrangement, the composition of the second ferromagnetic layer 7, i.e., magnetization free layer (information storage layer) was selected to be Substrate/Ta (3 nm)/PtMn (30 nm)/$Co_{90}Fe_{10}$ (2 nm)/Ru (0.8 nm)/$Co_{90}Fe_{10}$ (2 nm)/oxide film of Al (1 nm)/$(Co_{90}Fe_{10})_{90-x}B_{10}M3_x$ (3 nm)/Ta (5 nm)

In this film arrangement, the CoFe composition under the tunnel barrier layer other than the magnetization free layer was selected to be $Co_{90}Fe_{10}$ (atomic %). This comparative example has a similar arrangement to that of the inventive example 1 except that with respect to the $(Co_{90}Fe_{10})_{90-x}B_{10}M3_x$, in order to contrast its result with the result of the $Co_{90}Fe_{10}$ alloy of the comparative example 1, the ratio between the ferromagnetic transition metal chemical elements was fixed to Co: Fe=90:10 (atomic %) and the amount of the M3 (Mg, Zn) was changed from 1 atomic % to 40 atomic %.

COMPARATIVE EXAMPLE 4

In the film arrangement of the TMR element 1, this comparative example has a similar arrangement to that of the inventive example 1 except that a magnetization free layer is composed of a film having a composition of $(Co_{90}Fe_{10})_{95}B_5$ and that a substrate temperature required when the magnetization free layer is deposited was selected in a range of from 50° C. to 200° C.

COMPARATIVE EXAMPLE 5

In the film arrangement of the TMR element 1, this comparative example has a similar arrangement to that of the inventive example except that the second ferromagnetic layer 7 has a lamination layer structure such as Substrate/Ta (3 nm)/PtMn (30 nm)/$Co_{90}Fe_{10}$(2 nm)/Ru (0.8 nm)/$Co_{90}Fe_{10}$ (2 nm)/oxide film of Al (1 nm)/$Co_{90}Fe_{10}$ (2 nm) $(Co_{90}Fe_{10})_{80}B_{20}$ (1 nm)/Ta (5 nm)

Characteristics of the above-mentioned inventive examples and comparative examples were evaluated. When the magnetic memory element of the present invention is used as a memory element of a magnetic memory device, its magnetization free layer is inverted in magnetization as the information storage layer with application of a current magnetic field. In this characteristic evaluation, in order to evaluate the characteristics of the magnetic memory, the magnetization free layer was inverted in magnetization with application of an external magnetic field and thereby characteristics were evaluated.

The TMR element 1 that is used to evaluate magnetic characteristics and TMR ratios was an ellipse-shaped element having a minor axis of 0.8 μm and a major axis of 1.6 μm.

A magnetic field for inverting the magnetization of the information recording layer is applied to the information storage layer in parallel to the easy axis of the magnetization. An intensity of the magnetic field for this measurement was selected to be 500 [Oe] At the same time this magnetic field was swept from –500 [Oe] to +500 [Oe] as seen from one of the east axis of the magnetization of the information storage layer, the TMR element 1 was conducted in the direction perpendicular to the film plane by adjusting a bias voltage applied to the terminal 23 of the word line WL and the terminal 24 of the bit line BL such that it might reach 100 mV, and resistance values relative to external magnetic field values and TMR ratios were measured.

The TMR ratio was set to $(R_{max}-R_{min})/R_{min}$ where $R_{max}$ represents a resistance value obtained in the condition in which the magnetization of the magnetization fixed layer of the first ferromagnetic layer and the magnetization of the magnetization free layer (information storage layer) of the second ferromagnetic layer are anti-parallel to each other and in which the resistance value is high and $R_{min}$ represents a resistance value obtained in the condition in which the magnetization of the magnetization fixed layer and the magnetization of the magnetization free layer are parallel to each other and in which the resistance value is low.

A measurement temperature was set to a room temperature of 25° C.

A coercive force Hc was calculated from a magneto-resistance R—external magnetic field H characteristic curve that had been calculated from this measurement method. A crystal structure was observed by a TEM (transmission electron microscope: Transmission Electron Microscopy). In that case, a crystal structure in which a grain boundary was not observed from a bright field image of the TEM and in which a halo ring was observed from an electron beam diffraction figure was determined as an amorphous structure.

A bias dependence was measured such that, while a bias voltage was changed at the unit of 100 mV in a range of from 100 to 1000 mV, an R—H loop was measured, a TMR ratio was calculated and a bias dependence was plotted to the bias voltage.

Plotted results will be described below.

1. With Respect to Coercive Force and TMR Ratio

TMR-ratios and coercive forces of the information storage layers of the inventive examples 1 to 7 and the comparative examples 1 to 5 were evaluated. Their evaluated results were shown and effects of the present invention will be described.

[1-1]. In the Case in which the Magnetization Free Layer of which the Magnetization is Inverted does not Contain Added Chemical Element Added to FMTM (Transition Metal):

Specifically, the magnetization free layer of the comparative example 1 had a conventional arrangement in which $Co_{90}Fe_{10}$, $Co_{75}Fe_{25}$, $Co_{50}Fe_{50}$, $Ni_{80}Fe_{20}$ In that case, from observed results obtained by the TEM, it was confirmed that these materials are of crystal.

TABLE 1

| Composition of magnetization free layer | Coercive force Hc (Oe) | TMR ratio (%) |
|---|---|---|
| $Co_{90}Fe_{10}$ | 40 | 37 |
| $Co_{75}Fe_{25}$ | 55 | 42 |
| $Co_{50}Fe_{50}$ | 60 | 40 |
| $Ni_{80}Fe_{20}$ | 25 | 30 |

Although the inverted magnetic field Hc of the information storage layer in the TMR element 1 could be changed depending upon size, shape and thickness of the element, the size of the element 1 was determined such that the minor axis was fixed to 0.8 µm and the major axis was fixed to 1.6 µm, magnetic material dependences of the TMR elements 1 in which respective magnetic materials were used to form the magnetization free layers of the information storage layers were compared with each other.

Depending upon the structures of word lines and bit lines for generating a current magnetic field, as the inverted magnetic field of the magnetization free layer of the TMR element increases, the write current increases. Therefore, reduction of the inverted magnetic field leads to the decrease of the write current and the decrease of the power consumption.

Having compared the coercive force of the magnetic material of the comparative example 1 enumerated on the table 1, $Ni_{80}Fe_{20}$ which might be called a permalloy has the smallest coercive force Hc for influencing the magnitude of the write current value, and it is to be understood that the write current value can be suppressed. This permalloy has a TMR ratio of about 30%, which is small as compared with other materials.

For this reason, a read output voltage or output current becomes insufficient. On the other hand, although the $Co_{75}Fe_{25}$ alloy has the largest TMR ratio as compared with these materials, this alloy has a large coercive force Hc so that write electric power increases. Specifically, it is to be understood that it is difficult to satisfy the read characteristic and the write characteristic at the same time.

When the magnetization free layer comprising the information storage layer is composed of conventional crystal material, problems arise, in which the CoFe alloy, in particular, is not excellent in rectangle property of a resistance-magnetic field curve so that the inverted magnetic field is changed each time it is measured, and therefore is not stabilized.

Figure 5A:
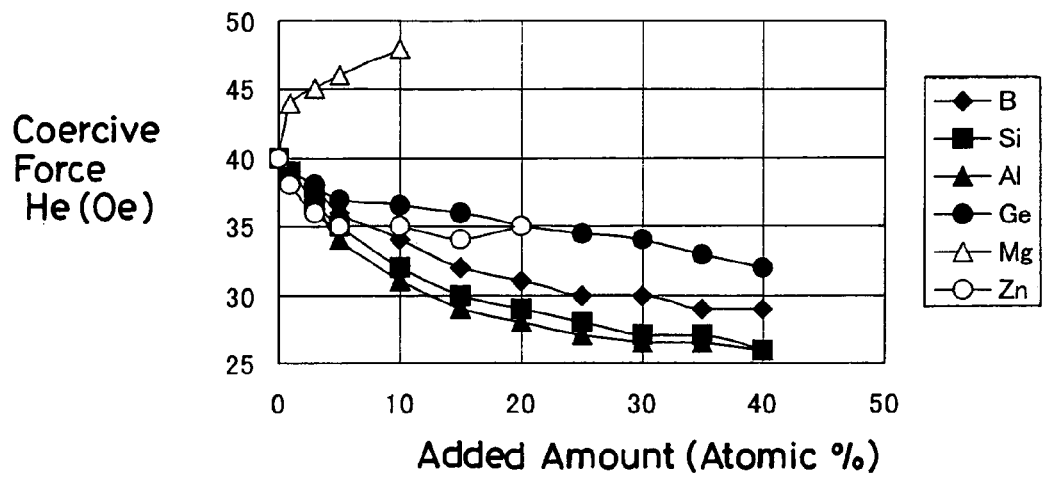
FIG. 5A is a diagram of characteristic curves showing a relationship among kinds, added amounts and coercive forces of 3B-group added chemical element to 5B-group added chemical element in the composition of $(Co_{90}Fe_{10})_{100-x}M_x$ (M represents B, Si, Al, Ge, Mg, Zn) and shows measured results of 2A-group Mg and 2B-group Zn as comparative examples.
Figure 5B:
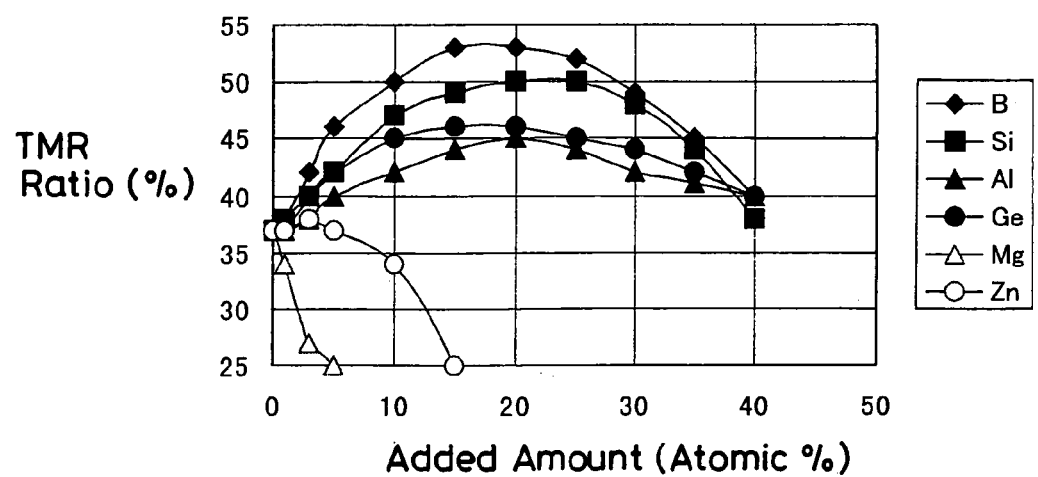
FIG. 5B is a diagram of characteristic curves showing a relationship among kinds, added amounts and TMR ratios of 3B-group added chemical element to 5B-group added chemical element in the composition of $(Co_{90}Fe_{10})_{100-x}M_x$ (M represents B, Si, Al, Ge, Mg, Zn) and shows measured results of 2A-group Mg and 2B-group Zn as comparative examples.

[1-2]. Effects Achieved when Single Substances of 3B-Group Chemical Elements to 5B-Group Chemical Elements are Added to the FMTM:

FIGS. 5A and 5B show measured results of coercive forces Hc and TMR ratios for added amounts with respect to samples in which the FMTM was fixed to Co:Fe=90:10 in atomic % and in which B, Si, Al, Ge that are added 3B-group chemical elements to 5B-group chemical elements were added to this alloy while the added amount was being changed from 1 to 40% in atomic % and samples having the arrangement of the comparative example 2 and in which. Mg and Zn which are other chemical elements than 3B-group chemical elements to 5B-group chemical elements were added to this alloy while the added amount was being changed in a range of from 1 to 40% in atomic %.

In the arrangement in which B, Si, Al, Ge were added to the alloy, as the added amount increases, the TMR ratio tends to increase temporarily and to be lowered again. Then, it was confirmed that the inverted magnetic field Hc was lowered by additions of Si, B, Al, Ge.

However, although the inverted magnetic field Hc is lowered by addition of Mg of 2A-group chemical element, the effects in which the TMR ratios are increased in each of Si, B, Al, Ge could not be achieved.

When Zn of 2B-group chemical element was added to the alloy, neither the TMR ratio could be increased nor the inverted magnetic field Hc could be decreased.

Specifically, according to the arrangement in which these 2A-group chemical element and 2B-group chemical element are added, the increase of the TMR ratio and the decrease of the inverted magnetic field, i.e., the read characteristic and the write characteristic are not compatible each other and the above-mentioned alloy is not suitable for as the material of the magnetization free layer of the information storage layer in a magnetic memory element.

While the effects achieved when B, Si, Al, Ge were added as the 3B-group chemical element to 5B-group chemical element are shown in the above-mentioned inventive examples of the present invention, it is supposed that similar effects could be achieved with respect to C, P, Ga, In, As, Se, Sn, Sb, Te located near B, Al, Ge in a periodic table and whose features are similar, other metalloid chemical elements and 3B-group and 4B-group metallic chemical elements.

As described above, while B, Si, Al, Ge and the 3B-group to 5B-group metalloid chemical elements and metallic chemical elements located around these chemical elements in the periodic table and of which features are similar can achieve effects for improving TMR ratios and decreasing coercive forces, of these chemical elements, chemical elements such as B, Si, P, Al, Ge are particularly desirable.

From the results shown in FIGS. 5A and 5B, when the added amounts of these chemical elements are too small, the effects for improving TMR ratios are small and effects for decreasing coercive forces are small. If the aforementioned effects are achieved, then at least more than 5 atomic % of the 3B-group to 5B-group metalloid and metallic chemical elements should be added. If the added amount is too large, then although some added chemical element having an added amount of 40 atomic % can continue the coercive fore to decrease, the magnetization amount decreases too much. As a result, there is a risk that the TMR ratio will decrease. Even when the added amount exceeds 35%, there can be achieved the effect that the magnitude of the coercive force Hc will decrease. However, in order to make the low coercive force become compatible with a high TMR ratio, it is to be desired that the added amount should not exceed 35%. Therefore, it is to be desired that the most suitable added amount of the added chemical element that can improve the TMR ratio and make it and the coercive force become compatible with each other should fall within a range of from 5 to 35 atomic % when one chemical element is added to the FMTM.

Having observed TEM images of the cross sections of the magnetization free layer having the composition of the $(Co_{90}Fe_{10})_{80}B_{20}$ of the inventive example in which the coercive force could be decreased and of the magnetization free layer having the composition of the $(Co_{90}Fe_{10})_{97}B_3$ of the comparative example in which the effect for decreasing the coercive force is small, it is to be understood that the fine structure of the $(Co_{90}Fe_{10})_{80}B_{20}$ is an amorphous layer and the fine structure of the $(Co_{90}Fe_{10})_{97}B_3$ is microcrystal. It is considered that the coercive force Hc can be decreased because the fine structure is the microcrystal and amorphous layer.

As will be described in the magnetization decision behavior item that will be described later on, since the fine structure is the amorphous layer, the rectangle property of the resistance-magnetic field curve can be improved, the behavior of the magnetization inversion can be stabilized, and the dispersions of the magnetization inversion can be decreased. From this standpoint, when the magnetization free layer is formed of the amorphous ferromagnetic material, the read characteristics can be improved, and therefore the amorphous ferromagnetic material is the suitable material as the magnetization free layer.

[1-3]. Effects Achieved by Addition of More than Two Kinds of 3B-Group to 5B-Group Chemical Elements:

The effect for increasing the TMR ratio and the effect for decreasing the coercive force according to the present invention can be achieved only when only one kind of 3B-group to 5B-group metalloid chemical elements is contained but also when more than two kinds of them are contained.

Figure 6A:
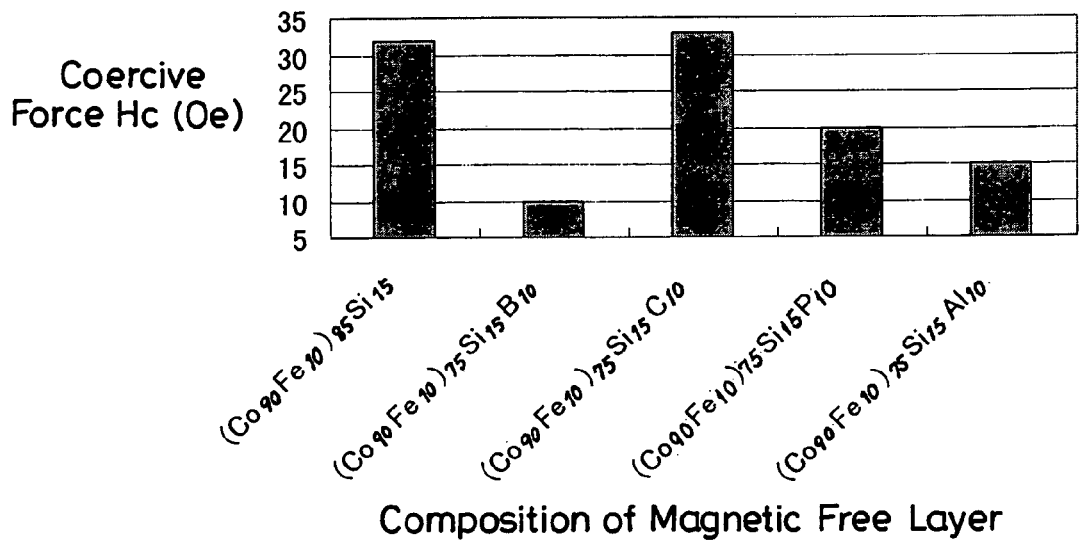
FIG. 6A is a diagram showing a relationship between a composition of a material of a magnetization free layer and a coercive force measured when Si and two kinds of B, C, Al, P were added at the same time as the compositions of $(Co_{90}Fe_{10})_{75}Si_{15}M_{10}$ (M represents B, C, Al, P)
Figure 6B:
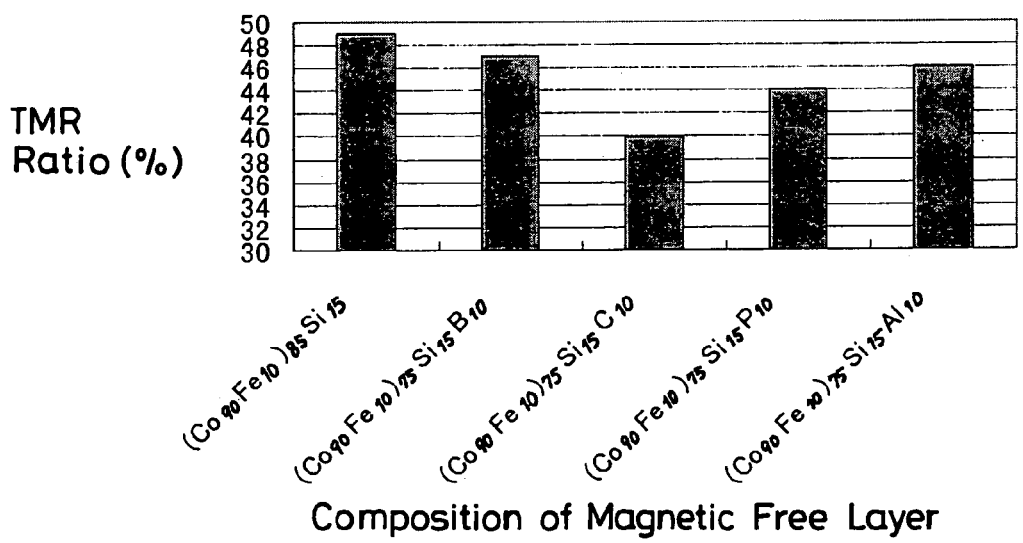
FIG. 6B is a diagram showing a relationship between a composition of a material of a magnetization free layer and a TMR ratio measured when Si and two kinds of B, C, Al, P were added at the same time as the compositions of $(Co_{90}Fe_{10})_{75}Si_{15}M_{10}$ (M represents B, C, Al, P)

The arrangement of the inventive example 2 contains more than two kinds of these chemical elements. FIGS. 6A and 6B show results obtained when Si was selected as the first added chemical element, the added amount was selected to be 15 atomic % and B, C, P, Al were added as the second added chemical elements. Even when the suitable material contains more than two kinds of these chemical elements, it can be recognized that the coercive force Hc can be decreased and the TMR ratio can be increased as has been described in the above-described [1-2]. In particular, when Si, B and Si, Al are added at the same time, the coercive force Hc can be decreased remarkably.

As described above, the TMR ratio can be increased and the coercive force can be decreased when the arrangement of the present invention contains one kind or two kinds of 3B-group to 5B-group metalloid chemical elements and metallic chemical elements.

Moreover, it is to be considered that similar effects can be achieved even when the arrangement of the present invention contains more than three kinds of 3B-group to 5B-group metalloid chemical elements and metallic chemical elements.

Therefore, 3B-group to 5B-group chemical elements are not limited in particular, and one kind or more than two kinds should preferably be selected from B, C, Si, P, Al.

[1-4]. Composition Dependence of Ferromagnetic Transition Metal Chemical Elements Obtained When 20 Atomic % of B is Added to the Arrangement of the Present Invention:

Of the magnetization free layer material of the present invention in which chemical elements were added to make the magnetization free layer become amorphous, with respect to the composition ratios of Fe, Co, Ni which are ferromagnetic chemical elements and TMR ratios and values of coercive force Hc, effects of the present invention will be described with reference to measured results of a sample in which 20 atomic % of B in the inventive example 3 was added and a sample that does not use the added chemical elements of the comparative example 1.

Figure 7A:
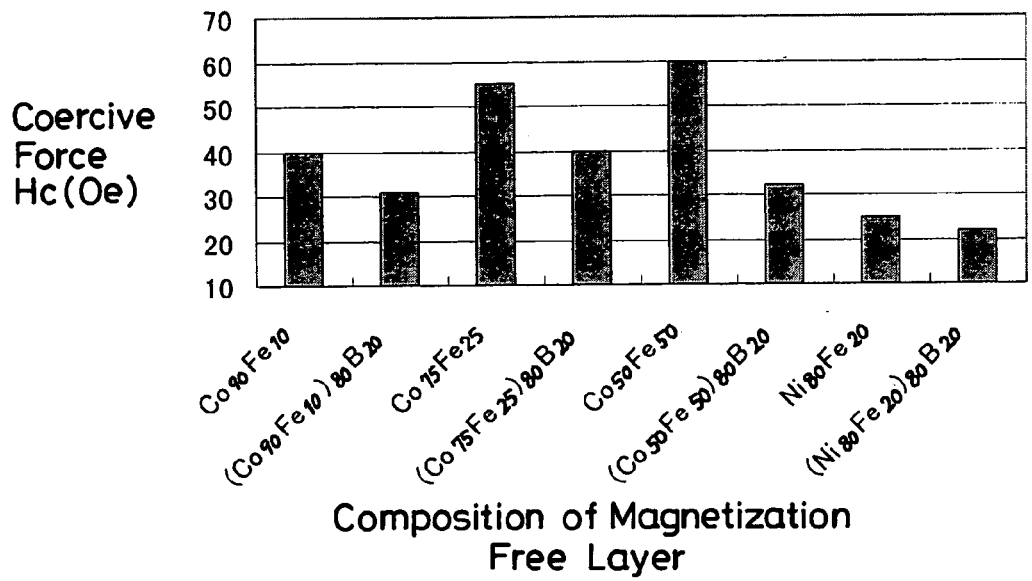
FIG. 7A is a diagram showing a relationship between a composition dependence (B is added with a constant added amount of 20 atomic %) of a ferromagnetic transition metal of a magnetization free layer and a coercive force in the composition of $(Co_xFe_yNi_z)_{80}B_{20}$ and shows measured results obtained when B is not added to the composition as a comparative example.
Figure 7B:
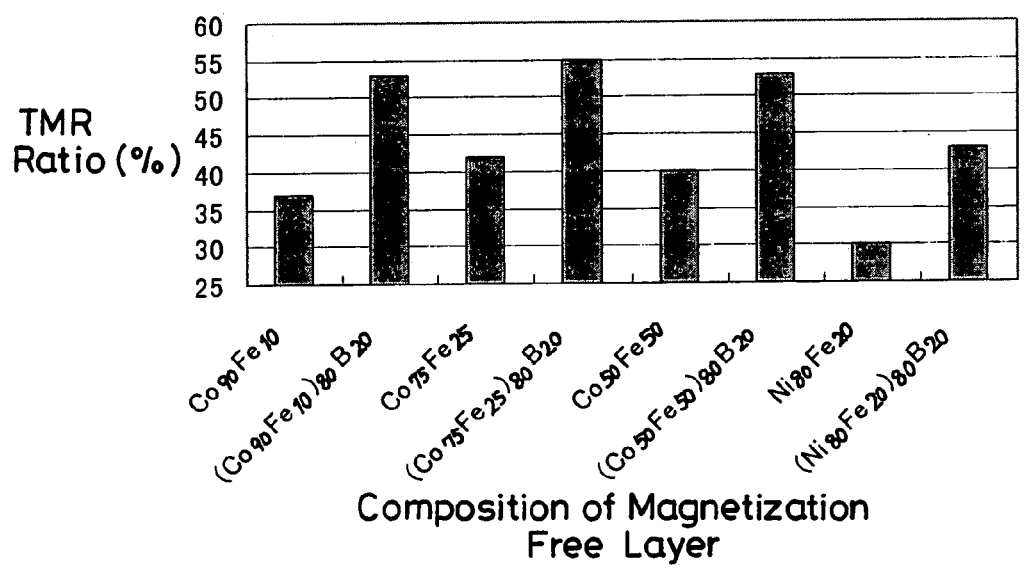
FIG. 7B is a diagram showing a relationship between a composition dependence (B is added with a constant added amount of 20 atomic %) of a ferromagnetic transition metal of a magnetization free layer and a TMR ratio in the composition of $(Co_xFe_yNi_z)_{80}B_{20}$ and shows measured results obtained when B is not added to the composition as a comparative example.

FIGS. 7A and 7B show measured results of the inventive example 3 and the comparative example 1 altogether. In the sample in which B that is 3B-group to 5B-group chemical elements of the present invention is added, the composition ratio of any ferromagnetic transition metal of $Co_{90}Fe_{10}$, $Co_{75}Fe_{25}$, $Co_{50}Fe_{50}$, $Ni_{80}Fe_{20}$ can increase the TMR ratio and decrease the coercive force Hc as shown in the inventive example 1 of the aforementioned [1-2].

Therefore, these effects are not limited to the compositions of CoFe, NiFe, and such effects can be achieved with respect to a magnetic memory element including an alloy-based magnetization free layer in which approximately 5 to 35 atomic % of Al which is one of 3B-group to 5B-group metalloid chemical elements are added to Fe, Co, Ni having any composition range.

Moreover, with respect to the added chemical elements, the arrangement of the present invention may contain not only N shown herein but also 3B-group to 5B-group metalloid and metallic chemical elements and Al or the added chemical elements of the present invention that will be described later on.

Figure 8A:
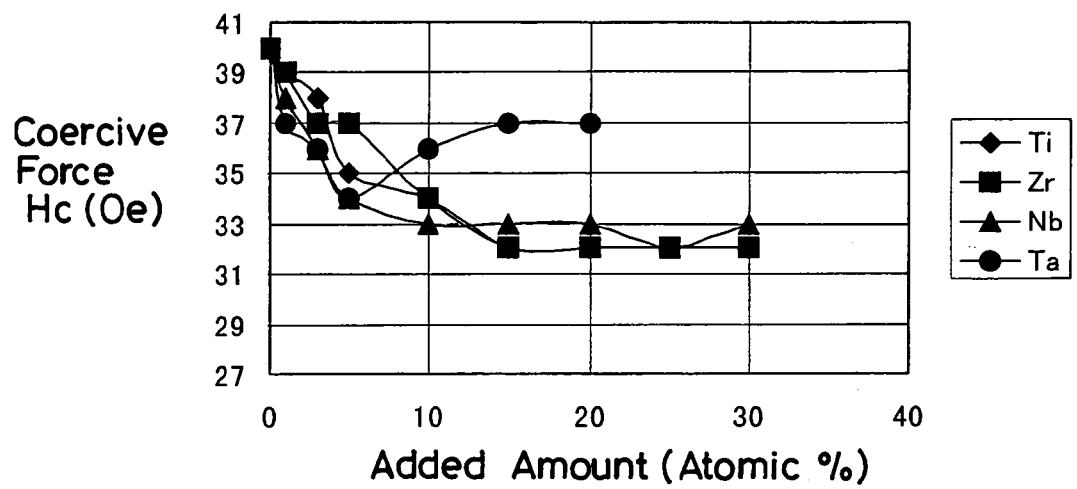
FIG. 8A is a diagram showing a relationship among added chemical elements added amounts and coercive forces of a magnetization free layer material with 4A-group chemical element and 5A-group chemical element added in the composition of $(Co_{90}Fe_{10})_{100-x}M_x$ (M represents Ti, Zr, Nb, Ta of 4A-group chemical element and 5A-group chemical element)
Figure 8B:
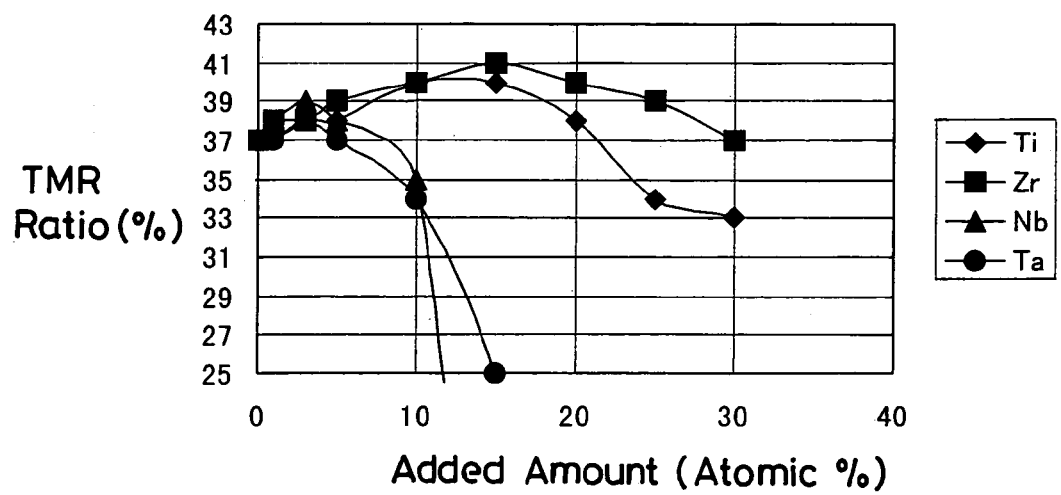
FIG. 8B is a diagram showing a relationship among added chemical elements, added amounts and TMR ratios of a magnetization free layer material with 4A-group chemical element and 5A-group chemical element added in the composition of $(Co_{90}Fe_{10})_{100-x}M_x$ (M represents Ti, Zr, Nb, Ta of 4A-group chemical element and 5A-group chemical element)

[1-5]. Effects Achieved by Addition of One Kind of 4A-Group and 5A-Group Chemical Elements:

FIGS. 8A and 8B show composition dependences of coercive forces Hc and TMR ratios obtained when Ti, Zr, Nb, Ta of so-called bubble metals of 4A-group and 5A-group metals are added to the FMTM in the sample having the arrangement of the inventive example 4.

The coercive force Hc can be decreased by the addition of these chemical elements. With respect to the sample with the added amount of 15 atomic % in which the coercive force Hc can be decreased through the TEM observation in which FMTM-Zr alloy was used in the magnetization free layer, it is to be understood that this sample has the amorphous layer. On the other hand, with the added amount of 3 atomic %, the effect for decreasing the coercive force Hc is small. It is considered that the reason for this is based upon the effect for making the sample become amorphous or making the crystal grain become fine. The coercive force Hc can be decreased in Ta, Zr, Nb as described above, and similar effects can be achieved in so-called bubble metals of 4A-group and 5A-group metals. Although the added amount is not limited in particular so long as the above-mentioned effect can be achieved, from the experimental results shown in FIGS. 8A and 8B, the added amount should preferably be selected to be approximately 25 atomic % at the most in a range in which a satisfactory TMR ratio can be obtained and the coercive force Hc can be decreased. It is needless to say that similar effects can be achieved not only when these added chemical elements are solely added to the FMTM but also at least one kind or more than two kinds of these added chemical elements are contained in the samples.

Figure 9A:
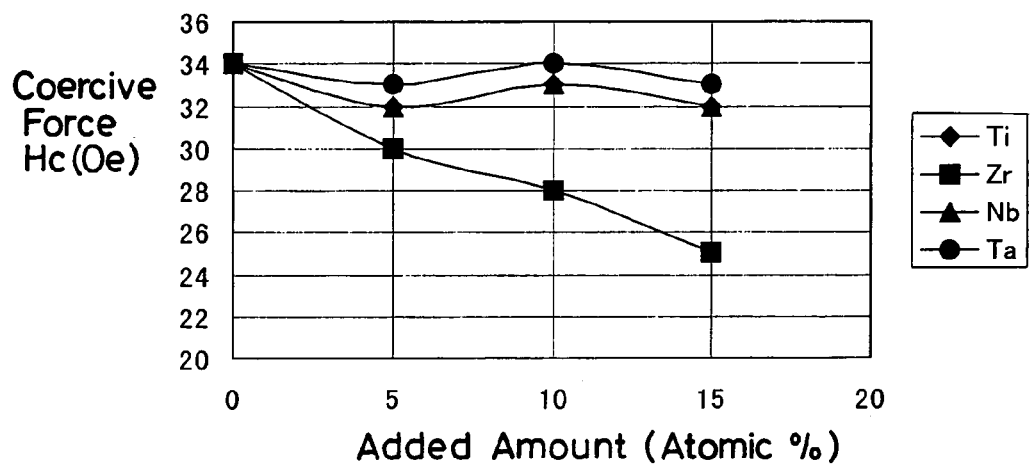
FIG. 9A is a diagram showing a relationship among added chemical elements, added amounts and coercive forces of a magnetization free layer material into which 10 atomic % of B, 4A-group chemical element and 5A-group chemical element were added at the same time as in the composition of $(Co_{90}Fe_{10})_{90-x}M_xB_{10}$ (M represents Ti, Zr, Nb, Ta of 4A-group chemical element and 5A-group chemical element)
Figure 9B:
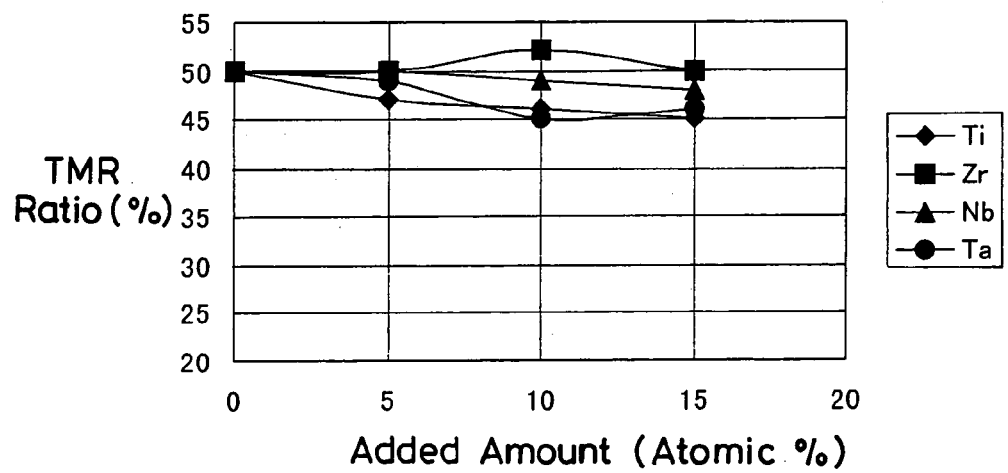
FIG. 9B is a diagram showing a relationship among added chemical elements, added amounts and TMR ratios of a magnetization free layer material into which 10 atomic % of B, 4A-group chemical element and 5A-group chemical element were added at the same time as in the composition of $(Co_{90}Fe_{10})_{90-x}M_xB_{10}$ (M represents Ti, Zr, Nb, Ta of 4A-group chemical element and 5A-group chemical element)

[1-6]. Effects Achieved When 3B-Group to 5B-Group Chemical Elements and 4A-Group and 5A-Group Chemical Elements are Added to the Samples:

FIGS. 9A and 9B show characteristic evaluation results obtained when 10 atomic % of B is added to the TMTM and Ti, Zr, Nb, Ta are contained in the sample of the inventive example 5. Having compared with the effects achieved by the addition of the 3B-group to 5B-group chemical elements in the inventive example 1, it is to be noted that, if these chemical elements are further added, the coercive force can be further decreased although the effects are small while the high TMR ratio obtained by the 3B-group to 5B-group chemical elements is being maintained. It is needless to say that these effects are not limited to Ti, Zr, Nb, Ta and it can be easily estimated that such effects can be achieved in Hf, v which are the 4A-group to 5A-group chemical elements that belong to the same groups in the periodic table.

[1-7]. Multinary System:

If the effects shown by the measured results of the TMR ratio and the coercive fore Hc are achieved, the arrangements of the inventive examples 1 to 5 should contain the above-mentioned 3B-group to 5B-group chemical elements and the 4A-group to 5A-group chemical elements, these arrangements may contain trace element of minute amount in addition to the above-mentioned chemical elements.

Figure 10A:
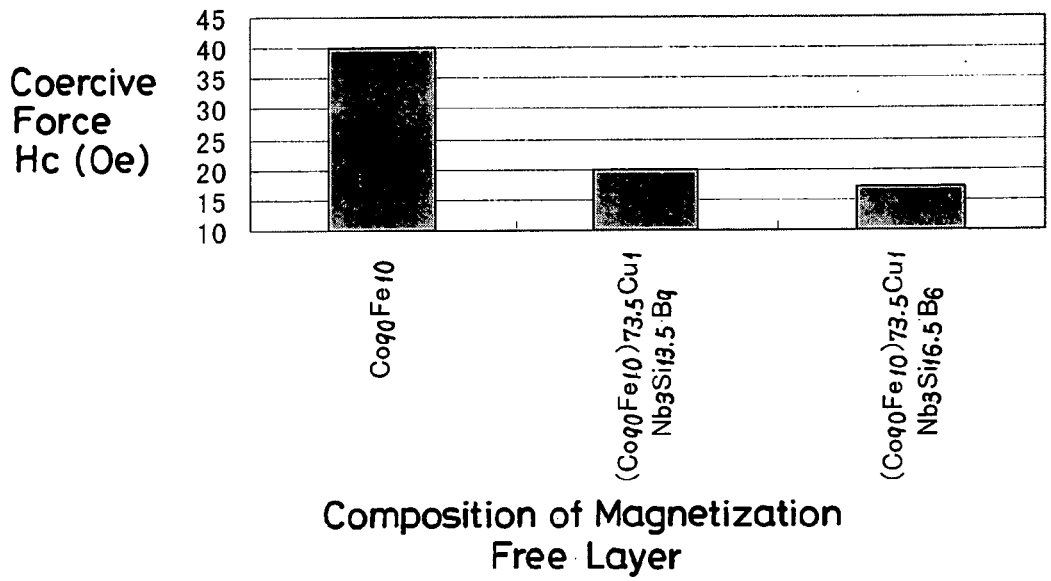
FIG. 10A is a diagram showing measured results of a coercive force of a magnetization free layer in which Cu, Nb, Si, B are added to CoFe at the same time.
Figure 10B:
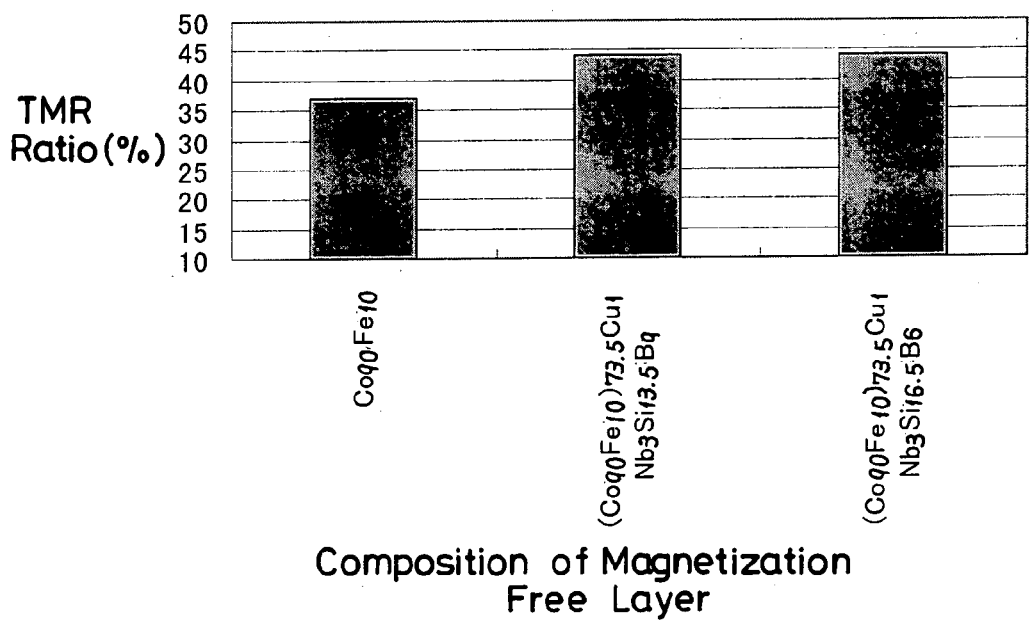
FIG. 10B is a diagram showing measured results of a TMR ratio of a magnetization free layer in which Cu, Nb, Si, B are added to CoFe at the same time.

FIGS. 10A and 10B show evaluated results obtained by the arrangements of the inventive example 6 and the comparative example 1. As illustrated, even the system which contains Cu in addition to the chemical elements that have been shown so far can decrease the coercive force Hc and can improve the TMR ratio.

Figure 11A:
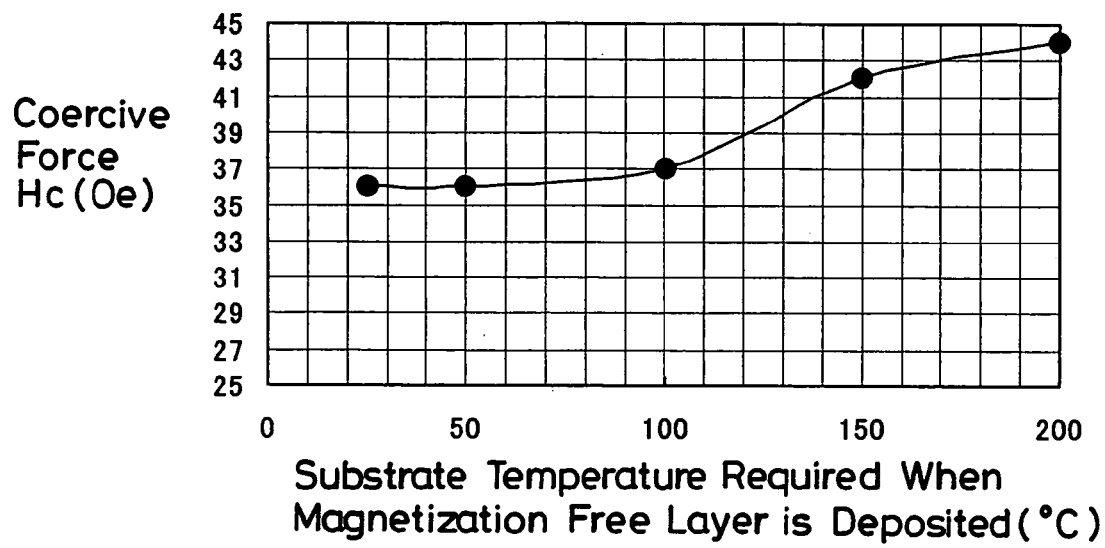
FIG. 11A is a diagram showing a relationship between a substrate temperature required when a magnetization free layer is deposited and a TMR ratio.
Figure 11B:
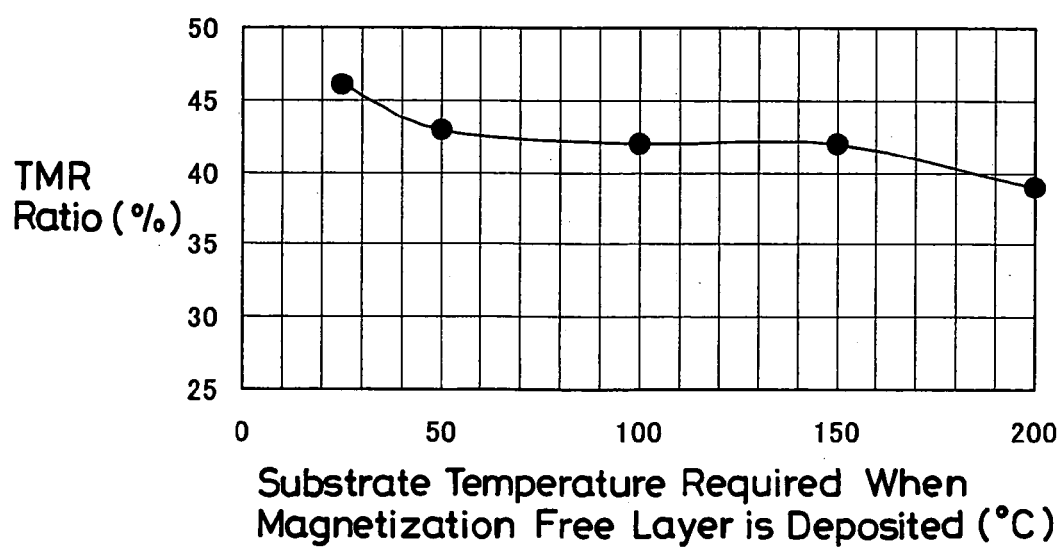
FIG. 11B is a diagram showing a relationship between a substrate temperature required when a magnetization free layer is deposited and a TMR ratio.

[1-8]. Substrate Temperature Obtained when Magnetization Free Layer is Deposited:

FIGS. 11A and 11B show the coercive force Hc and the TMR ratio relative to the substrate temperature with respect to the sample having the arrangement of the comparative example 4 in which effects of substrate temperatures obtained when the magnetization free layer is deposited have been examined. From the standpoint of conditions in which the amorphous layer is formed, the process for forming the magnetization free layer by heating the substrate exerts a bad influence upon the decrease of the coercive force Hc and the improvement of the TMR ratio that have been mentioned so far, and the result in which the magnetization free layer is deposited at room temperature is most excellent. Accordingly, from the view point of forming the amorphous structure, it is not preferable that the substrate is heated when the magnetization free layer is deposited. Hence, the substrate temperature should be at least less than 100° C. and the substrate should preferably be cooled.

Figure 12A:
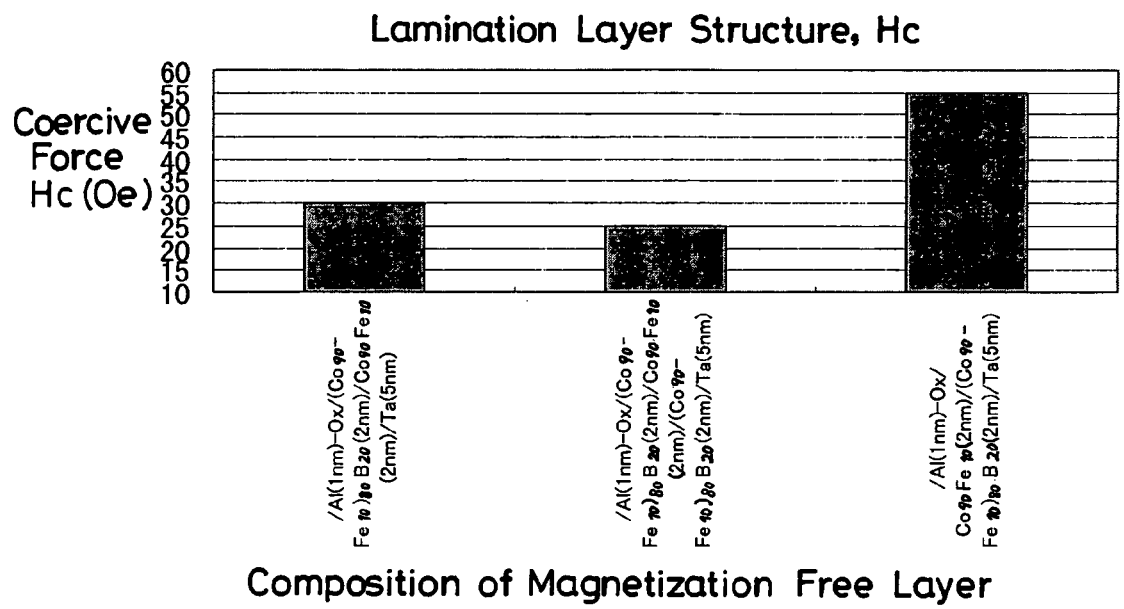
FIG. 12A is a diagram showing measured coercive forces obtained when a magnetization free layer has a lamination layer structure composed of a crystal material and an amorphous material.
Figure 12B:
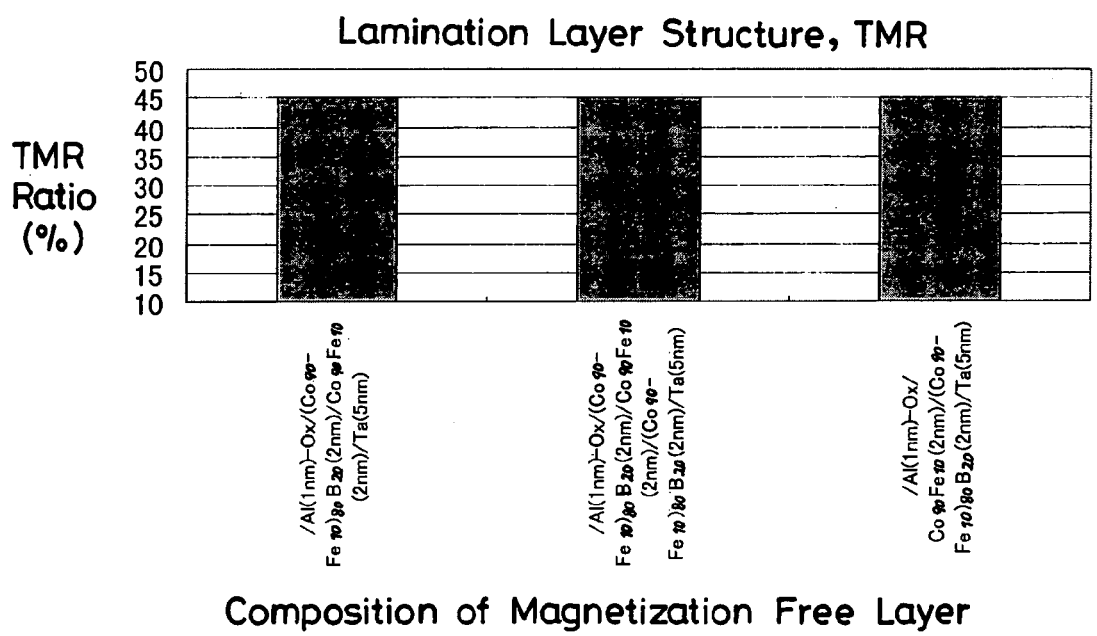
FIG. 12B is a diagram showing measured TMR ratios obtained when a magnetization free layer has a lamination layer structure composed of a crystal material and an amorphous material.

[1-9]. Lamination Layer Structure:

FIGS. 12A and 12B show measured results of magnetization free layer materials, the coercive forces Hc and the TMR ratios obtained when the magnetization free layers of the inventive example 6 and the comparative example 5 are formed so as to have lamination layer structures.

Coercive forces can be decreased and high TMR ratio can be achieved similarly by the magnetization free layers based on the lamination layer structure of the amorphous layer formed by the addition of one kind or more than two kinds of 3B-group to 5B-group chemical element metalloid and metallic chemical elements on the periodic table and the crystal layer. In this case, although the cause is not yet clear, the amorphous layer should preferably be used for the side of the tunnel barrier layer. When the crystal layer is laid adjacent to the side of the tunnel barrier layer., as shown in FIG. 11 in the comparative example 4, the decrease of the coercive force was not recognized.

Figures 13A, 13B:
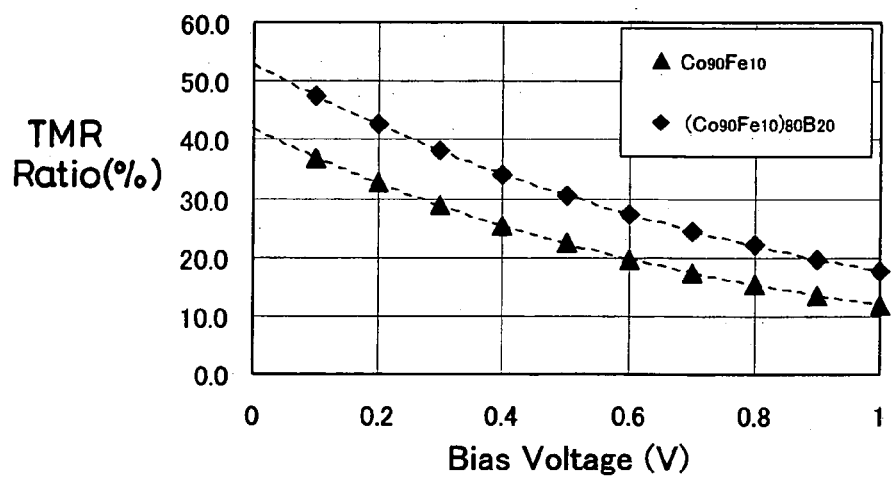
FIG. 13A is a diagram showing measured values of bias voltage dependences with respect to TMR ratios in the magnetization free layer according to the present invention.
FIG. 13B is a diagram showing characteristic curves obtained when bias voltage dependences with respect to TMR ratios in the magnetization free layer according to the present invention were plotted.

2. Bias Dependence:

FIGS. 13A and 13B show bias voltage dependences of TMR ratios obtained when the magnetization free layer is formed of the $Co_{90}Fe_{10}$ alloy of the comparative example 1 and the magnetization free layer is formed of the $(Co_{90}Fe_{10})_{80}B_{20}$.

FIG. 13A shows the bias voltage dependences in the form of measured values, and FIG. 13B is a graph in which these measured values are plotted. Although the cause is not yet clear at present, when the magnetization free layer of the present invention is in use as illustrated, the bias dependence can be improved, the output characteristic at real operation bias voltage can be improved so that it becomes easy to discriminate the low-resistance state and the high-resistance state. As a result, the read characteristic of the magnetic memory element can be improved.

Figure 14:
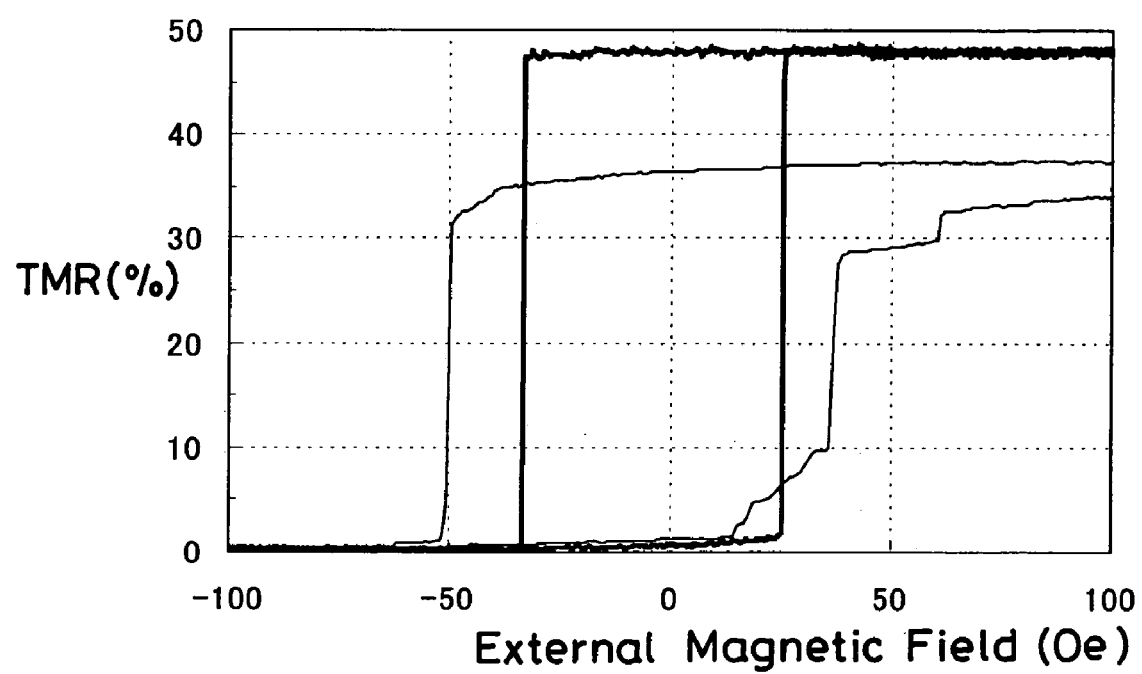
FIG. 14 is a diagram showing resistance versus external magnetic field curves obtained when a magnetization free layer is composed of $(Co_{90}Fe_{10})_{80}B_{20}$ and $Co_{90}Fe_{10}$.

3. Magnetization Inversion Behavior:

Similarly in FIG. 14, a resistance-external magnetic field curve obtained when the magnetization free layer is formed of the $(Co_{90}Fe_{10})_{80}B_{20}$ of the inventive example 1 and a resistance-external magnetic field curve obtained when the magnetization free layer is formed of the $Co_{90}Fe_{10}$ alloy of the comparative example 1 are shown by curves 40 and 41, respectively. As described above, when the information storage layer of the present invention is used, the coercive force Hc can be decreased while the high TMR ratio can be maintained. Moreover, the rectangle property of the R—H loop can be improved, and the Barkhausen noise also can be decreased. As a result, not only the write current can be decreased but also the shape of the asteroid curve can be improved and hence the write characteristic can be improved, thereby making it possible to decrease the write error.

Figure 15A:
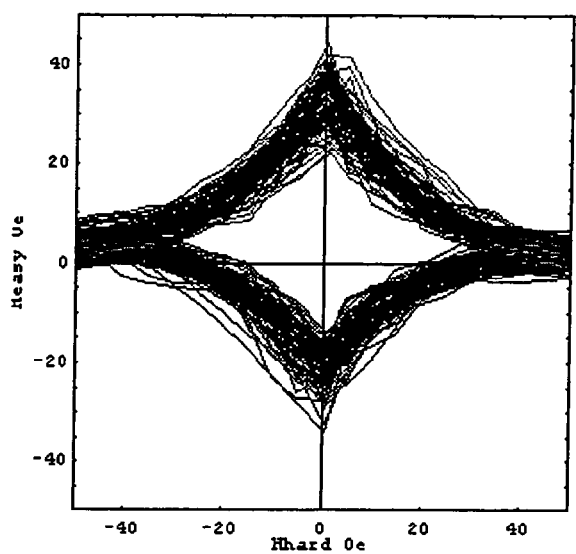
FIG. 15A is a diagram showing asteroid characteristic curves obtained when a magnetization free layer is composed of $(Co_{90}Fe_{10})_{80}B_{20}$.
Figure 15B:
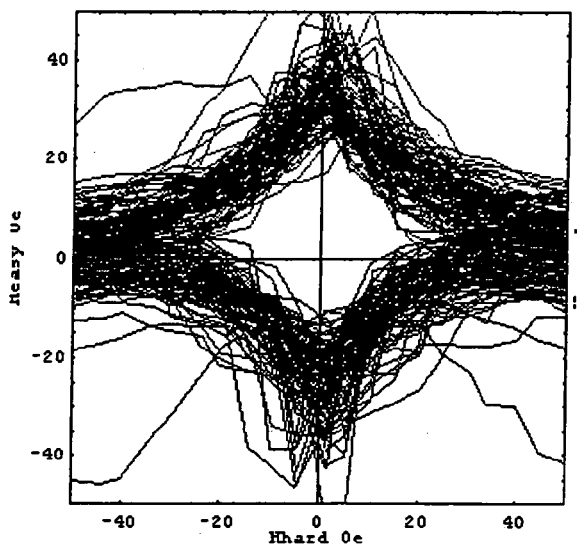
FIG. 15B is a diagram showing asteroid characteristic curves obtained when a magnetization free layer is composed of $Co_{90}Fe_{10}$.

FIGS. 15A and 15B show measured results obtained when asteroid curves of 20 elements have been overlapped. FIG. 15A shows measured result when the magnetization free layer is made of $(Co_{90}Fe_{10})_{80}B_{20}$ and FIG. 15B shows measured results when the magnetization free layer is made of $Co_{90}Fe_{10}$. As is clear from the results obtained when FIGS. 15A and 15B have been compared with each other, it is to be understood that, when the magnetization free layer is formed of $Co_{90}Fe_{10}$ which is the conventional crystal material, most of the asteroid curves is deviated from the ideal asteroid shape. Hence, this magnetic memory is inferior in read characteristic. However, when the magnetization free layer is made of the amorphous ferromagnetic material of the present invention, the asteroid shape can become ideal and can be stabilized.

This effect can be achieved not only when the memory element uses the magnetization free layer having the material composition shown in FIG. 15 but also when the amorphous ferromagnetic material in the range of the present invention is used in the main portion of the magnetization free layer. Therefore, according to the present invention, the write characteristic to the memory element can be improved considerably, and the write error of the MRAM can be decreased.

Figure 16:
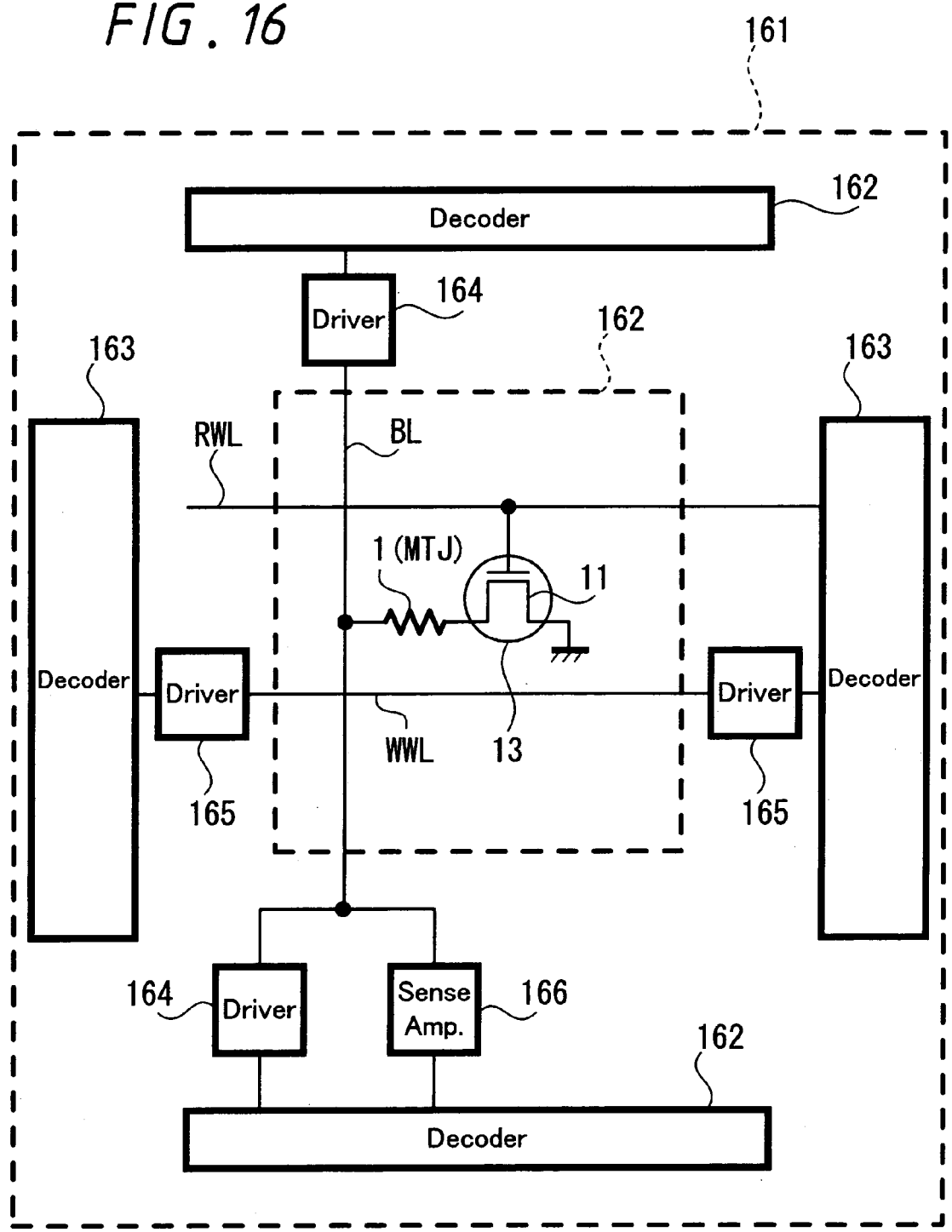
FIG. 16 is a block diagram showing a magnetic memory device.

Next, a specific circuit arrangement of an example of a magnetic memory device MRAM according to the present invention will be described with reference to FIG. 16 which shows a block diagram of a circuit arrangement. This MRAM comprises a cell array portion 160 formed by the array of memory cells 11 and a marginal circuit portion 161.

The cell array portion 160 comprises a plurality of memory cells 11 arranged in rows and columns. Each memory element includes a memory element 1 composed of MTJ and a transistor 13 that can select the cell.

The marginal circuit portion 161 includes decoders 162, 163 for selecting the cell from address information, drivers 164, 165 for causing a write current to flow, a sense amplifier 166 for selecting a read current and the like.

Then, the marginal circuit portion 161 includes a bit line BL, a write word line WWL and a read word line RWL, each of which is extended to the cell array portion 160. The bit line BL is connected to the decoder 162, and each memory cell 11 is accessed through the bit line BL.

Write operations, read operations in this magnetic memory device MRAM and respective arrangements thereof will be described.

[Write Operation]

In order to write information in the memory cell 11, it is necessary to use a magnetic field generated by a current. The lines BL and WWL are interconnections necessary for causing a current to flow. The lines BL and WWL are located so as to cross each other in the upper and lower direction across the memory cell as mentioned hereinbefore. The drivers (inverters) 164 and 165 for applying a write current are connected to both ends of the lines BL and WWL. The gates of the drivers are connected to the decoders 162 and 163 for converting address data inputted from the outside and select the lines BL and WWL to which the write current should be applied.

In the line BL for generating the inverted magnetic field for inverting the magnetization direction of the information storage layer 7 of the memory element, i.e., magnetoresistive effect element, the direction of the write current, i.e., the information write current of "0" or "1" may be controlled based upon the data line input. On the other hand, in the line WWL for generating an assist magnetic field, although the direction of the write current may be constant, considering the electromigration, the direction in which the current flows can be inverted each time information is written in the information storage layer.

[Read Operation]

The lines BL and RWL are used to read information from the memory cell in which information of "0" and "1" have been written as described above. A cell from which information is to be read out may be selected by a transistor 13 provided in each memory cell. The gate of the transistor is connected to the line RWL and the drain is connected to one end of the MTJ, respectively. Then, the other end of the MTJ is connected to the line BL. The lines BL and RWL are connected to the decoder and the lines BL and RWL thus selected for reading are alerted. A sense current may flow to the thus selected cell through the channel of the line BL, the MTJ and the transistor, and the magnitude of the sense current is detected by a sense amplifier 166. Specifically, "0" and "1" of recorded information may be discriminated from each other, i.e., recorded information may be read out from the memory cell.

In the magnetoresistive effect element in a magnetic sensor or the like, the magnetic memory element in the magnetic memory device according to the present invention that have been described so far, when the magnetization free layer is composed of a single layer of an amorphous or microcrystal material or the main portion of the magnetization free layer is composed of the amorphous or microcrystal material, more preferably, the single layer of or the main portion of the magnetization free layer is composed of the magnetic material in which one kind or more than two kinds of one or both of 3B-group, 4B-group and 5B-group chemical elements or 4A-group and 5A-group chemical elements are added to at least one kind or more than two kinds of ferromagnetic transition metal chemical elements Fe, Co, Ni on the periodic table.

According to this arrangement, as is clear from the above descriptions, in the magnetoresistive effect element, the rectangle property in the R—H characteristic may be made excellent and the noise may be decreased. Hence, this magnetoresistive effect element is suitable for use as magnetic sensors for various applications such as a magnetic detector and a magnetic head.

Moreover, in the magnetic memory element and the magnetic memory device, the read signal can be increased by increasing the TMR ratio, and the write current can be decreased. Further, when information is read out from the magnetic memory element or the magnetic memory device, the bias dependence characteristic of the TMR ratio can be improved and then low-resistance state and the high-resistance state can be discriminated from each other with ease, thereby resulting in the read characteristic being improved. When information is written in the magnetic memory element or the magnetic memory device, the noise in the resistance-external magnetic field curve can be improved and the write error can be decreased. Specifically, both of the write characteristic and the read characteristic can be satisfied.

The invention claimed is:

1. A magnetoresistive effect element comprising:
a ferromagnetic tunnel junction having a tunnel barrier layer sandwiched between at least a pair of ferromagnetic layers; and
a magnetization free layer composed of one of said ferromagnetic layers is comprised of a single layer of (1) a material having an amorphous or microcrystal structure or (2) a material layer of which the main portion is made of a material layer having an amorphous or microcrystal structure,
wherein,
said magnetization free layer contains at least one kind or more than two kinds of 4A-group chemical elements and 5A-group chemical elements on a periodic table and added chemical elements of Cu, N, O, and S of which the content is less than 2 atomic %.

2. The magnetoresistive effect element according to claim 1, wherein said magnetization free layer contains at least one kind or more than two kinds of metalloid chemical elements and metallic chemical elements which are 3B-group chemical elements, 4B-group chemical elements and 5B-group chemical elements on a periodic table relative to at least one kind or more than two kinds of components of ferromagnetic chemical elements of Fe, Co, and Ni.

3. The magnetoresistive effect element according to claim 2, wherein said magnetization free layer uses any one kind or more than two kinds of B, C, Al, Si, P, Ga, Ge, As, In, Sn, Sb, Tl, Pb, and Bi as said metalloid chemical elements and said metallic chemical elements.

4. The magnetoresistive effect element according to claim 2, wherein said magnetization free layer uses any one kind or more than two kinds of B, Al, Si, Ge, and P as said metalloid chemical elements and said metallic chemical elements.

5. The magnetoresistive effect element according to claim 2, wherein said magnetization free layer contains said metalloid chemical elements and said metallic chemical elements of which the content lies in a range of from 5 to 35 atomic %.

6. The magnetoresistive effect element according to claim 3, wherein said magnetoresistive effect element contains said metalloid chemical elements and said metallic chemical elements of which the content lies in a range of from 5 to 35%.

7. The magnetoresistive effect element according to claim 4, wherein said magnetization free layer contains said metalloid chemical elements and metallic chemical elements of which the content lies in a range of from 5 to 35%.

8. The magnetoresistive effect element according to claim 1, wherein said magnetization free layer contains at least one kind or more than two kinds of 4A-group chemical elements and 5A-group chemical elements on a periodic table relative to at least one kind or more than two kinds of component of ferromagnetic chemical elements of Fe, Co, and Ni.

9. The magnetoresistive effect element according to claim 8, wherein said magnetization free layer uses at least one kind or more than two kinds of Ti, Zr, Nb, Hf, and Ta as said 4A-group chemical elements and said 5A-group chemical elements.

10. The magnetoresistive effect element according to claim 8, wherein said magnetization free layer contains said 4A-group chemical elements and said 5A-group chemical elements of which the content lies in a range of from 5 to 25 atomic %.

11. The magnetoresistive effect element according to claim 9, wherein said magnetization free layer contains said 4A-group chemical elements and said 5A-group chemical elements of which the content lies in a range of from 5 to 25 atomic %.

12. The magnetoresistive effect element according to claim 1, wherein said magnetization free layer contains at least one kind or more than two kinds of metalloid chemical elements and metallic chemical elements which are 3B-group chemical elements, 4B-group chemical element and 5B-group chemical elements on a periodic table relative to at least one kind or more than two kinds of components of ferromagnetic chemical elements of Fe, Co, and Ni and also contains at least one kind or more than two kinds of 4A-group chemical elements, 6A-group chemical elements on a periodic table.

13. The magnetoresistive effect element according to claim 1, wherein said magnetization free layer has a main portion located on the side of said tunnel barrier layer.

14. A magnetic memory element comprising:
a ferromagnetic tunnel junction having a tunnel barrier layer sandwiched between at least a pair of ferromagnetic layers, and
an information storage layer comprising a magnetization free layer composed of one of said ferromagnetic layers is made of a single layer of (1) a material having an amorphous or (2) a microcrystal structure or a material layer of which the main portion has an amorphous or microcrystal structure,
wherein,
said information storage layer contains at least one kind or more than two kinds of 4A-group chemical elements and 5A-group, chemical elements on a periodic table and added chemical elements of Cu, N, O, and S of which the content is less than 2 atomic %.

15. The magnetic memory element according to claim 14, wherein said information storage layer contains at least one kind or more than two kinds of metalloid chemical elements and metallic chemical elements which are 3B-group chemical elements, 4B-group chemical elements and 5B-group chemical elements on a periodic table relative to at least one kind or more than two kinds of components of ferromagnetic chemical elements of Fe, Co, and Ni.

16. The magnetic memory element according to claim 15, wherein said information storage layer uses any one kind or more than two kinds of B, C, Al, Si, P, Ga, Ge, As, In, Sn, Sb, Tl, Pb, and Bi as said metalloid chemical elements and said metallic chemical elements.

17. The magnetic memory element according to claim 15, wherein said information storage layer uses any one kind or more than two kinds of B, Al, Si, Ge, and P as said metalloid chemical elements and said metallic chemical elements.

18. The magnetic memory element according to claim 15, wherein said information storage layer contains said metalloid chemical elements and said metallic chemical elements of which the content lies in a range of from 5 to 35 atomic %.

19. The magnetic memory element according to claim 16, wherein said information storage layers contains said metalloid chemical elements and said metallic chemical elements of which the content lies in a range of from 5 to 35 atomic %.

20. The magnetic memory element according to claim 17, wherein said information storage layer contains said metalloid chemical elements and said metallic chemical elements of which the content lies in a range of from 5 to 35 atomic %.

21. The magnetic memory element according to claim 14, wherein said information storage layer contains at least one kind or more than two kinds of 4A-group chemical elements and 5A-group chemical elements on a periodic table relative to at least one kind or two kinds of components of ferromagnetic chemical elements of Fe, Co, and Ni.

22. The magnetic memory element according to claim 21, wherein said information storage layer uses at least one kind or more than two kinds of Ti, Zr, Nb, Ef, and Ta as said 4A-group chemical elements and said 5A-group chemical elements.

23. The magnetic memory element according to claim 21, wherein said information storage layer contains said 4A-group chemical elements and said 5A-group chemical said information storage of which the content lies in a range of from 5 to 25 atomic %.

24. The magnetic memory element according to claim 22, wherein said information storage layer contains said 4A-group chemical elements and said 5A-group chemical elements of which the content lies in a range of from 5 to 25 atomic %.

25. The magnetic memory element according to claim 14, wherein said information storage layer contains at least one kind or more than two kinds of metalloid chemical elements and metallic chemical elements which are 3B-group chemical elements, 4B-group chemical elements and 5B-group chemical elements on a periodic table relative to at least one kind or more than two kinds of components of ferromagnetic chemical elements of Fe, Co, and Ni and also contains at least one kind or more than two kinds of 4A-group chemical elements and 5A-group chemical elements on a periodic table.

26. The magnetic memory element according to claim 14, wherein said information storage layer has a main portion located on the side of said tunnel barrier layer.

27. A magnetic memory device comprising:
word lines and bit lines crossing each other in a three-dimensional fashion; and
a magnetic memory element composed of a magnetoresistive effect element located at a crossing point between said word line and said bit line, said magnetic memory element being formed of a magnetoresistive effect element using a ferromagnetic tunnel junction having a tunnel barrier layer sandwiched between at least a pair of ferromagnetic layers, and an information storage layer of a magnetization free layer composed of one of said ferromagnetic layers being comprised of a single layer of a material having an amorphous or microcrystal structure or a material layer of which the main portion has an amorphous or microcrystal structure,
wherein
said information storage layer contains at least one kind or more than two kinds of metalloid chemical elements and metallic chemical elements which are 3B-group chemical elements. 4B-group chemical elements, 5B-group chemical elements on a periodic table, at least one kind or more than two kinds of 4A-group chemical elements, 5A-group chemical elements on a periodic table and added chemical elements of Cu, N, O, and S of which the contents are less than 2 atomics relative to at least one kind or more than two kinds of ferromagnetic chemical elements of Fe, Co, and Ni.

28. The magnetic memory device according to claim 27, wherein said information storage layer contains at least one kind or more than two kinds of metalloid chemical elements and metallic chemical element which are 3B-group chemical elements, 4B-group chemical elements, 5B-group chemical elements on a periodic table relative to at least one kind or more than two kinds of ferromagnetic chemical elements of Fe, and Co.

29. The magnetic memory device according to claim 28, wherein said information storage layer uses any one kind or more than two kinds of B, C, Al, Si, P, Ga, Ge, As, In, Sn, Sb, Ti, Pb, and Bi as said metalloid chemical elements and said metallic chemical elements.

30. The magnetic memory device according to claim 28, wherein said information storage layer uses any one kind or more than two kinds of B, Al, Si, Ge, and O as said metalloid chemical elements and said metallic chemical elements.

31. The magnetic memory device according to claim 28, wherein said metalloid chemical elements content and said metallic chemical elements content of said information storage layer fall within a range of from 5 to 35 atomic %.

32. The magnetic memory device according to claim 29, wherein said metalloid chemical elements content and said metallic chemical elements content of said information storage layer fall within a range of from 5 to 35 atomic %.

33. The magnetic memory device according to claim 30, wherein said metalloid chemical elements content and said metallic chemical elements content of said information storage layer fall within a range of from 5 to 35 atomic %.

34. The magnetic memory device according to claim 27, wherein said information storage layer contains at least one kind or more than two kinds of 4A-group chemical elements, 5A-group chemical elements on a periodic table relative to at least one kind or more than two kinds of components of ferromagnetic chemical elements of Fe, Co, and Ni.

35. The magnetic memory device according to claim 34, wherein said information storage layer uses at least one kind or more than two kinds of Ti, Zr, Nb, Hf, and Ta as said 4A-group chemical elements and said 5A-group chemical elements.

36. The magnetic memory device according to claim 34, wherein said 4A-group chemical elements content and said 5A-group chemical elements content of said information storage layer fall within a range of from 5 to 25 atomic %.

37. The magnetic memory device according to claim 35, wherein said 4A-group chemical elements content and said 5A-group chemical elements content of said information storage layer fall within a range of from 5 to 25 atomic %.

38. The magnetic memory device according to claim 14, wherein said information storage layer contains at least one kind or more than two kinds of metalloid chemical elements and metallic chemical elements which are 3B-group chemical elements, 4B-group chemical elements, 5B-group chemical elements on a periodic table and at least one kind or more than two kinds of 4A-group chemical elements, 5A-group chemical elements on a periodic table relative to at least one kind or more than two kinds of components of ferromagnetic chemical elements of Fe, Co, and Ni.

39. The magnetic memory device according to claim 27, wherein said information storage layer has a main portion located on the side of said tunnel barrier layer.

* * * * *